US010072333B2

(12) United States Patent
Ouderkirk et al.

(10) Patent No.: US 10,072,333 B2
(45) Date of Patent: Sep. 11, 2018

(54) SHEET COATING METHOD

(71) Applicant: 3M INNOVATIVE PROPERTIES COMPANY, St. Paul, MN (US)

(72) Inventors: Andrew J. Ouderkirk, St. Paul, MN (US); Nicholas T. Gabriel, Woodbury, MN (US); Max Powers, Minneapolis, MN (US); Bill H. Dodge, Finlayson, MN (US); Timothy J. Nevitt, Red Wing, MN (US); Daniel J. Schmidt, Woodbury, MN (US); James R. Miller, Hudson, WI (US); Robert R. Kieschke, Woodbury, MN (US); Erin A. McDowell, Afton, MN (US); Kelly S. Johnson, Columbia Heights, MN (US)

(73) Assignee: 3M INNOVATIVE PROPERTIES COMPANY, St. Paul, MN (US)

( * ) Notice: Subject to any disclaimer, the term of this patent is extended or adjusted under 35 U.S.C. 154(b) by 182 days.

(21) Appl. No.: 14/905,223

(22) PCT Filed: Jul. 16, 2014

(86) PCT No.: PCT/US2014/046828
§ 371 (c)(1),
(2) Date: Jan. 14, 2016

(87) PCT Pub. No.: WO2015/009811
PCT Pub. Date: Jan. 22, 2015

(65) Prior Publication Data
US 2016/0153087 A1    Jun. 2, 2016

Related U.S. Application Data

(60) Provisional application No. 61/846,675, filed on Jul. 16, 2013.

(51) Int. Cl.
| | | |
|---|---|---|
| *C23C 16/455* | (2006.01) | |
| *C23C 16/458* | (2006.01) | |
| *C03C 17/00* | (2006.01) | |
| *C03C 17/25* | (2006.01) | |
| *C03C 17/42* | (2006.01) | |
| *B05D 7/00* | (2006.01) | |
| *G02B 5/28* | (2006.01) | |

(52) U.S. Cl.
CPC .......... *C23C 16/45525* (2013.01); *B05D 7/00* (2013.01); *C03C 17/001* (2013.01); *C03C 17/002* (2013.01); *C03C 17/25* (2013.01); *C03C 17/42* (2013.01); *C23C 16/4583* (2013.01); *C23C 16/45502* (2013.01); *C23C 16/45546* (2013.01); *C23C 16/45555* (2013.01); *C23C 16/45557* (2013.01); *C03C 2217/42* (2013.01); *C03C 2217/73* (2013.01); *G02B 5/288* (2013.01)

(58) Field of Classification Search
CPC ................... C23C 16/45525; C23C 16/45548
See application file for complete search history.

(56) References Cited

U.S. PATENT DOCUMENTS

| | | | |
|---|---|---|---|
| 6,812,157 B1 * | 11/2004 | Gadgil | .............. C23C 16/45551 117/200 |
| 8,234,998 B2 | 8/2012 | Krogman | |
| 2002/0108570 A1 | 8/2002 | Lindfors | |
| 2003/0049372 A1 | 3/2003 | Cook | |
| 2004/0157047 A1 | 8/2004 | Mehrabi | |
| 2005/0268848 A1 | 12/2005 | Wang | |
| 2006/0032442 A1 | 2/2006 | Hasebe | |
| 2006/0258157 A1 * | 11/2006 | Weimer | ........... C23C 16/45546 438/685 |
| 2007/0031598 A1 * | 2/2007 | Okuyama | .............. C23C 16/308 427/248.1 |
| 2007/0045863 A1 * | 3/2007 | Hsieh | ....................... H01L 24/11 257/777 |
| 2007/0065578 A1 * | 3/2007 | McDougall | ......... C23C 16/4404 427/248.1 |
| 2007/0148350 A1 * | 6/2007 | Rahtu | ..................... C23C 16/32 427/249.17 |
| 2007/0269982 A1 | 11/2007 | Rocklein | |
| 2008/0050884 A1 | 2/2008 | Koyanagi | |
| 2008/0096369 A1 * | 4/2008 | Strzyzewski | ..... C23C 16/45551 438/478 |
| 2009/0246971 A1 | 10/2009 | Reid et al. | |
| 2010/0166955 A1 | 7/2010 | Becker et al. | |
| 2012/0196050 A1 * | 8/2012 | Vermeer | ........... C23C 16/45551 427/535 |
| 2012/0293586 A1 * | 11/2012 | Law | .......................... B41J 2/14 347/54 |

(Continued)

FOREIGN PATENT DOCUMENTS

| | | |
|---|---|---|
| JP | 5-270997 | 10/1993 |
| JP | 2004-23043 | 1/2004 |
| WO | WO 2004-015742 | 2/2004 |
| WO | WO 2004-071677 | 8/2004 |

OTHER PUBLICATIONS

Cameron, M.A., et al., "Atomic Layer Deposition of SiO2 and TiO2 in Alumina Tubular Membranes: Pore Reduction and Effect of Surface Species on Gas Transport". Langmuir, 2000, 16, 7435-7444.*

(Continued)

*Primary Examiner* — Bret P Chen
(74) *Attorney, Agent, or Firm* — Clifton F. Richardson; Lance L. Vietzke

(57) ABSTRACT

A method of coating a plurality of sheets. A fluid is forced through gaps in the plurality of sheets. The fluid has a substantially plug flow profile and the fluid deposits a coating on at least one surface of the plurality of sheets in a self-limiting deposition process.

22 Claims, 23 Drawing Sheets

(56) References Cited

U.S. PATENT DOCUMENTS

2013/0129922 A1* 5/2013 Sasagawa ......... H01L 21/67069
427/255.7

OTHER PUBLICATIONS

Liu, Kuang-I., et al., "Uniform coating of TiO2 on high aspect ratio substrates with complex morphology by vertical forced-flow atomic layer deposition". RSC Adv., 2017, 7, 34730-34735.*
Dameron, "Molecular Layer Deposition of Alucone Polymer Films Using Trimethylaluminum and Ethylene Glycol", Chem. Mater. 2008, vol. 20, pp. 3315-3326.

George, "Molecular Layer Deposition of Organic and Hybrid Organic-Inorganic Polymers", Material Matters, 2008, 7 pages.
Sharma, "Spatial Atomic Layer Deposition on Flexible Substrates Using a Modular Rotating Cylinder Reactor", Journal of Vacuum Science & Technology, Jan./Feb., 2015, vol. 33, No. 1, pp. 01A132-1-01A132-8.
Soderlund, Beneq ALD Technology for Encapsulation of Organic Electronics, Feb. 2013, 14 pages.
Sundberg, "Organic and Inorganic-Organic Thin Film Structures by Molecular Layer Deposition: A Review", Journal of Nanotechnology, 2014, vol. 5, pp. 1104-1136.
International Search Report for PCT International PCT/US2014/046828 dated Nov. 27, 2014, 3 pages.

* cited by examiner

SHEET COATING METHOD

BACKGROUND

Thin glass film may be manufactured by one of several techniques. The most common methods are with a fusion draw tower, where molten glass flows over two surfaces, joins over a line, and is drawn into a sheet, or with a re-draw process where a glass plate is heated and drawn into a sheet. Either of these processes can produce thin glass with thicknesses of 100 microns or less.

Many applications of films, including glass films, may require thin film coatings. These coatings are commonly applied using vacuum-based physical vapor deposition (including chemical vapor deposition, sputtering, and evaporative coating). Vacuum processes can be accomplished by either batch processes, such as where the sheets are all contained in a vacuum chamber or air-vacuum-air processes where the supply and wind up rolls are at atmospheric pressure.

While these coating methods are commonly used, they are also expensive. There are several coating methods where roll processing is not generally economically feasible. These include chemical vapor deposition (CVD), low pressure CVD, and atomic layer deposition (ALD). These processes are commonly used in sheet-based processes, where entire plates may be coated at one time.

Besides the above mentioned vacuum-based vapor deposition coating methods, an ambient, liquid-based coating method called layer-by-layer (LBL) self-assembly may also be used to provide coatings on film and glass. LBL coating is a self-limiting deposition process similar to ALD; however it is carried out at ambient temperature and pressure, usually from aqueous solutions or dispersions. Traditionally, LBL coating has been done in batch mode using automated dip or spray coaters on relatively small area substrates. LBL coating in a continuous roll-to-roll fashion via immersion coating has been described in US Pat. App. No. 2004/0157047 (Mehrabi et al.) and LBL coating via spray coating has been described in U.S. Pat. No. 8,234,998 (Krogman et al.). However, to coat multiple layers (e.g. 50 to 100 layers) using these techniques in one pass requires a large footprint for the coating line.

There is a need in the art for a method of coating sheets that provides high performance coatings at a low cost and at a high through-put.

SUMMARY

A method of coating sheets consistent with the present disclosure includes the steps of providing a plurality of sheets with gaps between the sheets and forcing a fluid through the gaps. The fluid has a substantially plug flow profile and the fluid deposits a coating on at least one surface of the plurality of sheets in a self-limiting deposition process.

An article consistent with the present disclosure includes a plate rack, a plurality of coated plates disposed in the plate rack with gaps between the coated plates, and a manifold disposed adjacent an input edge of the plurality of coated plates. The manifold includes a fluid distribution system.

BRIEF DESCRIPTION OF THE DRAWINGS

The accompanying drawings are incorporated in and constitute a part of this specification and, together with the description, explain the advantages and principles of the invention. In the drawings.

DETAILED DESCRIPTION

Glass that is thin enough to be flexible can be made by several techniques, such as with a fusion draw tower where molten glass flows over two surfaces, joins over a line, and is drawn into a sheet, or with a re-draw process where a glass plate is heated and drawn into a sheet. The present description provides methods of coating this form of glass with high performance coatings at a low cost with high yield, low damage to the film or sheet, and at a high through-put. The high through-put is a result of the process requiring low volume reactors and efficiently using reactants. Both of these advantages are a result of the substantially plug flow coating process provided by the present description.

Plug flow is characterized as having a sharp transition from a first fluid composition to a second fluid composition.

For example, an array of sheets may be filled with a reactive fluid which is purged with a purge fluid, and in the case of plug flow, there will be a sharp demarcation between the reactive fluid and the purge fluid. There may be diffusion as the interface moves through the stack without departing from the scope of the present description. As used herein, "substantially plug flow profile" refers to a flow where there is a demarcation between a first fluid and a second fluid that is sharp or that is broadened by diffusion.

The methods of the present disclosure utilize self-limiting deposition processes. Suitable self-limiting processes that may be used includes atomic layer deposition (ALD) and liquid-based coating processes including the layer-by-layer (LBL) self-assembly process.

The coating methods can be used to apply inorganic and organic coatings, including polymeric materials, to sheets such as glass sheets. The coatings may be protective, decorative, and/or have optical or electrical functions. Example coatings include antireflectors, dichroic reflectors, broadband mirrors, and electrically conductive coatings, including metals and transparent conductive oxides (TCO). The sheets may contain polymer, glass, metal, ceramic, or a combination thereof.

Figure 1:
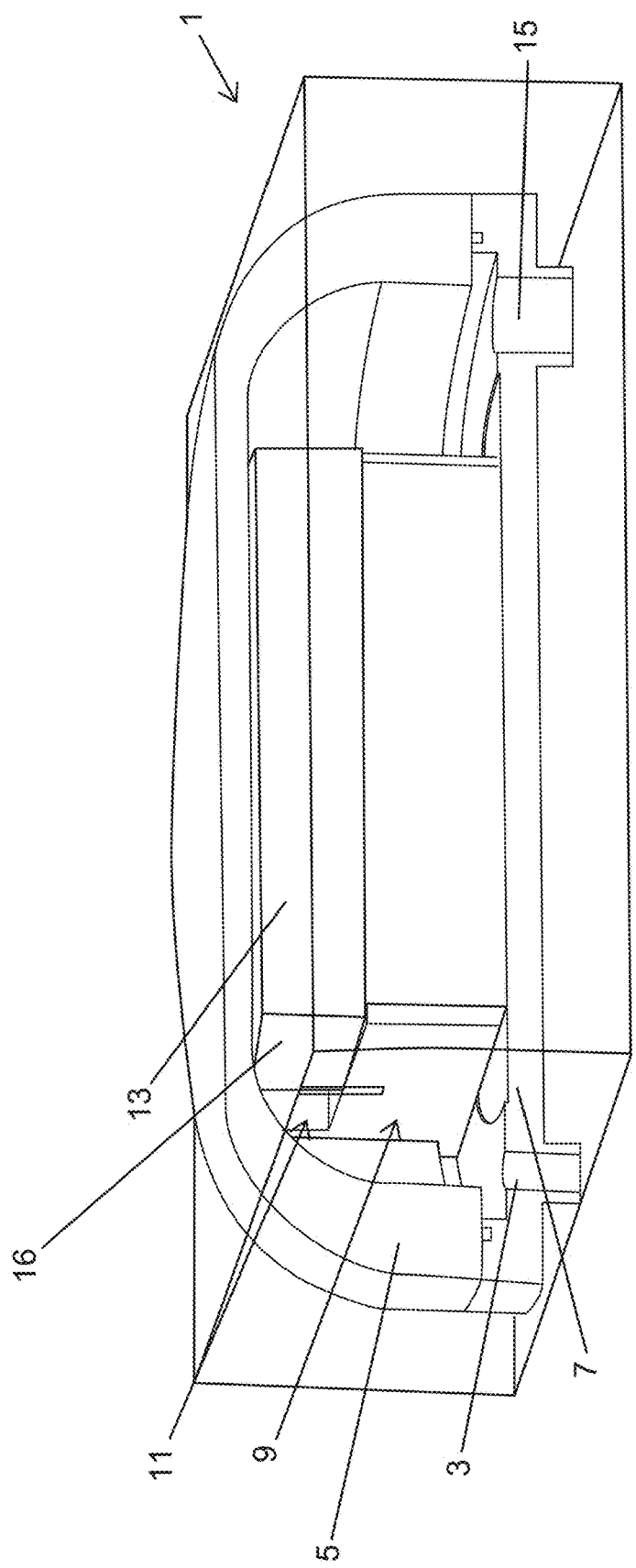
FIG. 1 is a perspective view of a cut away of a batch flow reactor.

FIG. 1 shows an ALD reactor 1 with a plurality of plates 13. There is a relatively large inlet volume 9 in front of an input edge 16 of the plates 13 and the plates 13 do not significantly constrain the flow. The reactor 1 has a gas inlet 3 feeding into a chamber defined by a top portion 5 and a bottom portion 7 with an inlet volume 9 distributing gas to a low flow resistance path 11 and through the stack of plates 13. The gas exhausts from the reactor through outlet 15.

Gas flow inside the reactor shown in FIG. 1 was simulated using Solidworks Flow simulation (Solidworks is available from Dassault Systems, Waltham, Mass., USA). The pressure at the outlet was fixed at 1 Torr, and the gas flow at the inlet was fixed at 0.000409 m$^3$/s of nitrogen. The gas and reactor temperature were both set at 250° C., and the reactor was initially filled with air. The plates were 0.2 mm thick and spaced with a 0.3 mm gap. The plates were 150×100 mm with the gas flow along the long axis.

Figure 2:
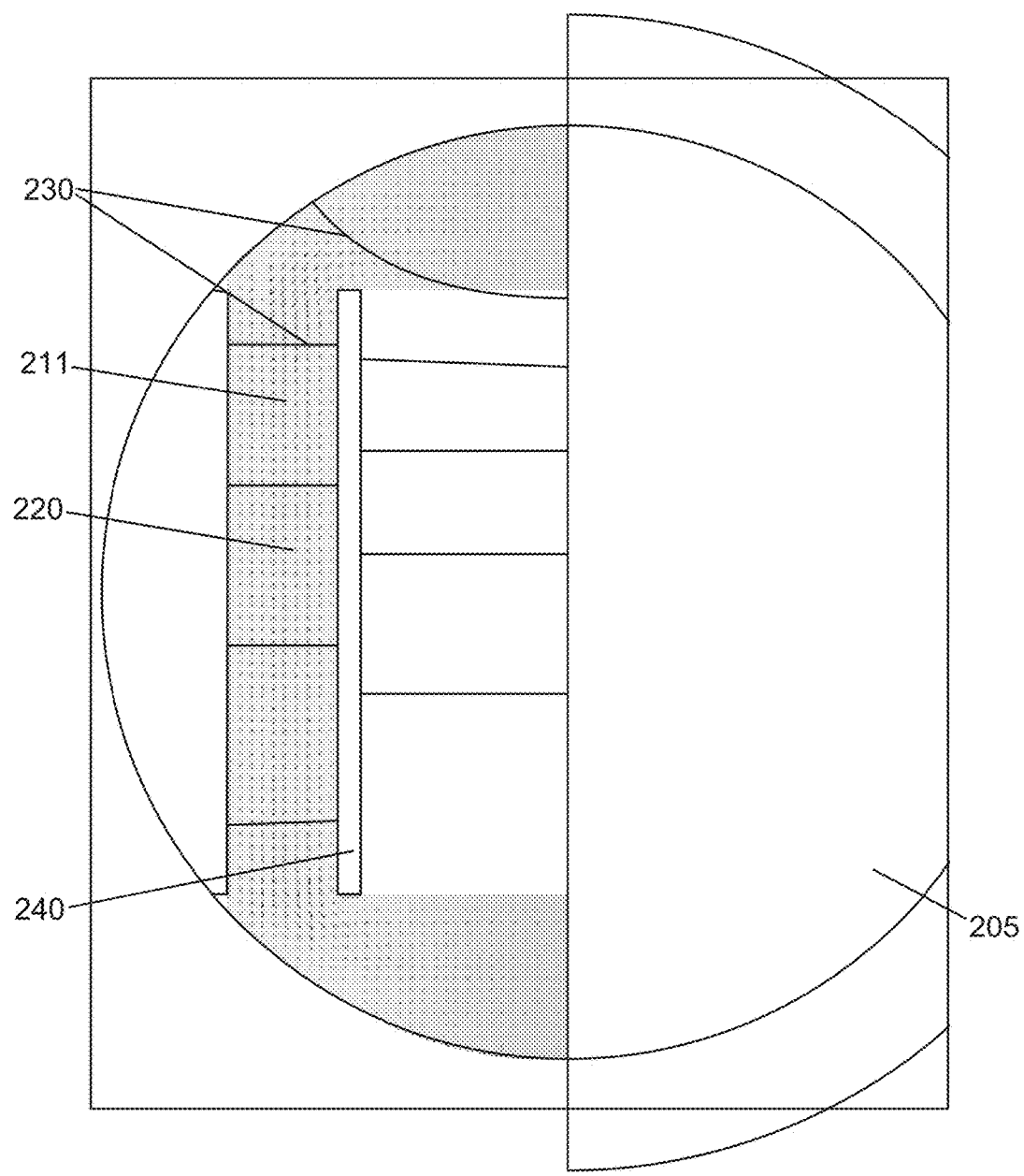
FIG. 2 is a plan view of a cut away of a batch flow reactor.

FIG. 2 shows the resulting velocity vectors 220 and isolines 230. The isolines 230 indicate the constant nitrogen composition and the length of each of the arrows is proportional to velocity. Also shown in FIG. 2 are top portion 205, low flow resistance path 211 and plate rack 240. This shows that a large fraction of the flow bypasses the stack of plates. A large area of flow bypass or a large gap or both can improve the flexibility of designing the reactor and can increase coating uniformity, but can significantly increase cycle time and reactant consumption. The ratio of pressure across the plates in this design is about 1.015:1. In some embodiments, the ratio of the pressure of the fluid on the input edge of the plates to the pressure of the fluid on the output edge of the plates is at least 1.01 or 1.05 or 1.1 or 1.2.

Figure 3:
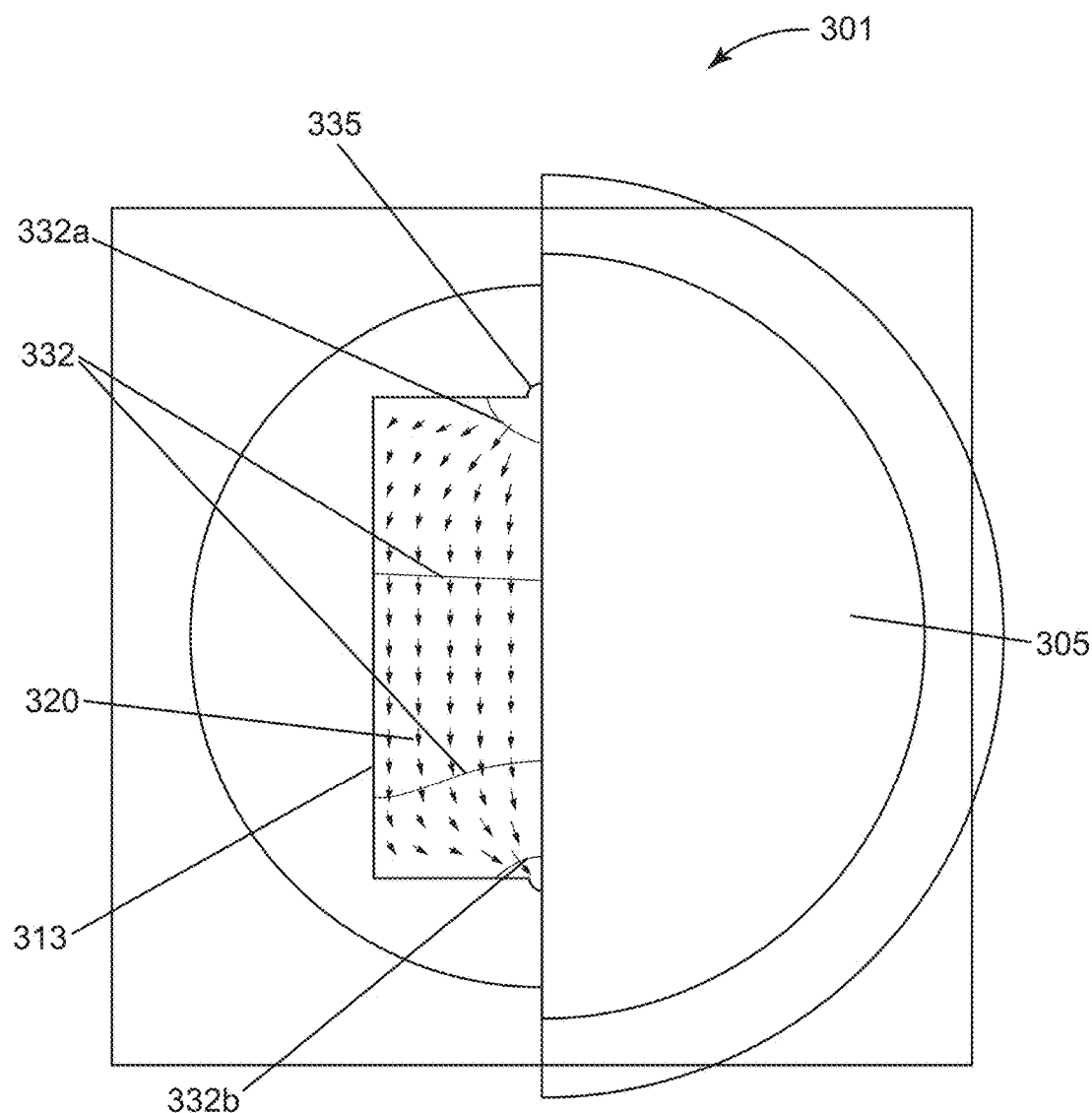
FIG. 3 is a plan view of a cut away of an ALD reactor.

FIG. 3 shows an improved reactor 301, where the inlet volume is minimized and the bypass is substantially reduced. In this case, the there is a much higher velocity 320 over the stack of plates 313 and reduced mixing of the inlet gas before reaching the plates, but there is a large range of velocities over the plates. This range of velocities will result in either worse uniformity or longer cycle times. Pressure isobars 332 are indicated in FIG. 3. Isobar 332a indicates a pressure of about 1.2 Torr and isobar 332b indicates a pressure of about 1.1 Torr. The ratio of pressure from the inlet to the outlet is 1.41:1. Reactor 301 includes top portion 305 and inlet manifold 335.

Figure 4:
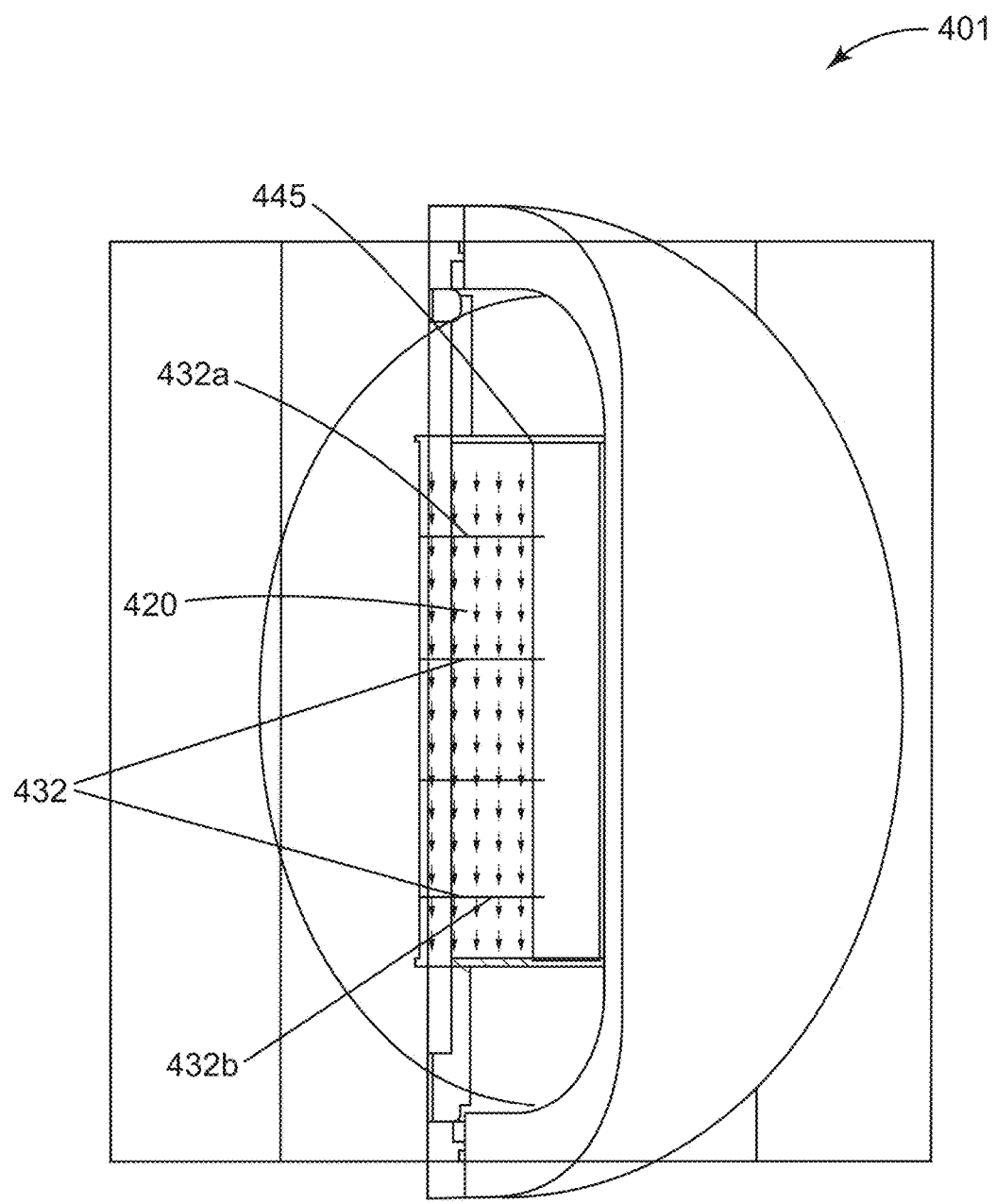
FIG. 4 is a perspective view of a cut away of an ALD reactor.

FIG. 4 shows a reactor 401 where the gas is efficiently distributed over the input face of the stack of plates or sheets. Distribution is improved by increasing the space 445 for gas flow in front of the sheets from a width of 0 to 3 mm. In this case the pressure ratio between the input and output is 1.34:1. In some embodiments, the space for gas flow in front of the sheets has a width in the range of 1 to 5 mm. Velocity vectors 420 and pressure isobars 432 are indicated in FIG. 4. Isobar 432a indicates a pressure of about 1.25 Torr and isobar 432b indicates a pressure of about 1.15 Torr.

Figure 5:
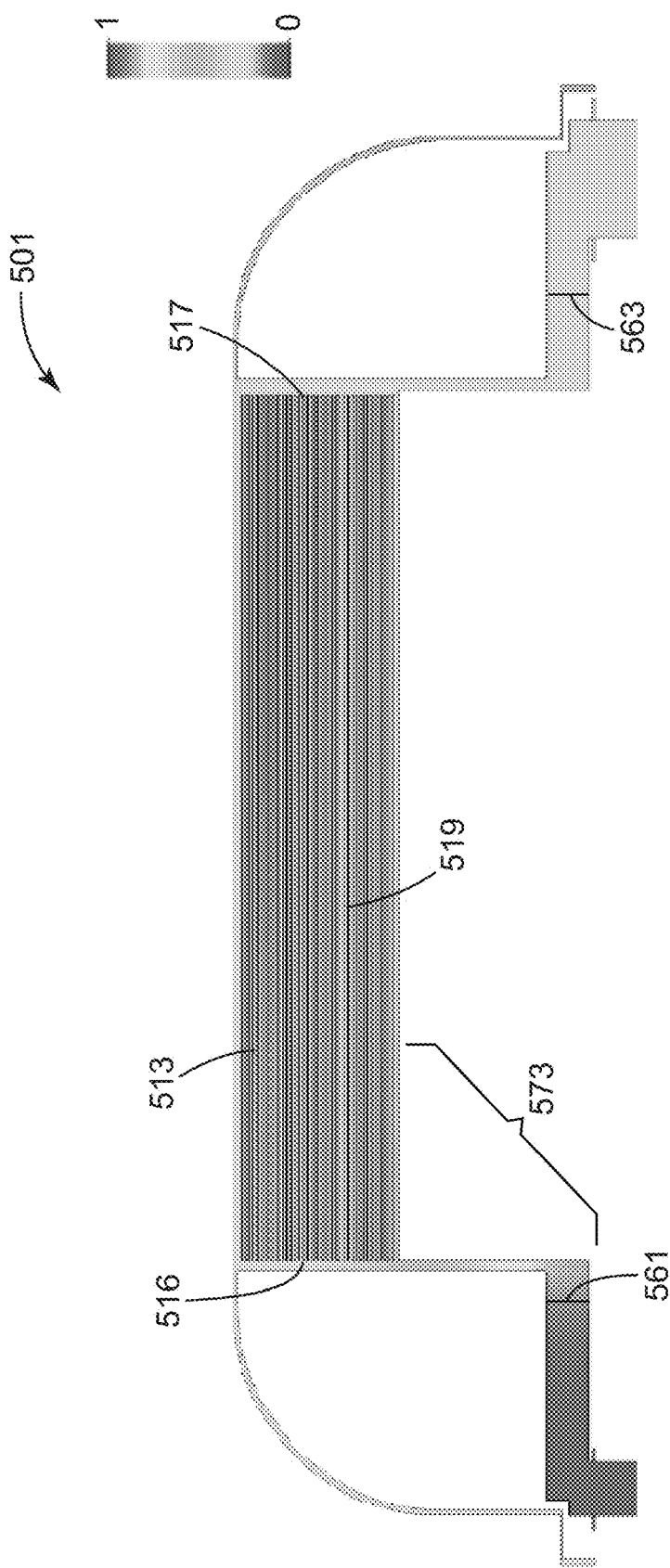
FIG. 5 is a cross-sectional view of an ALD reactor showing mass fraction of nitrogen contours.
Figure 6:
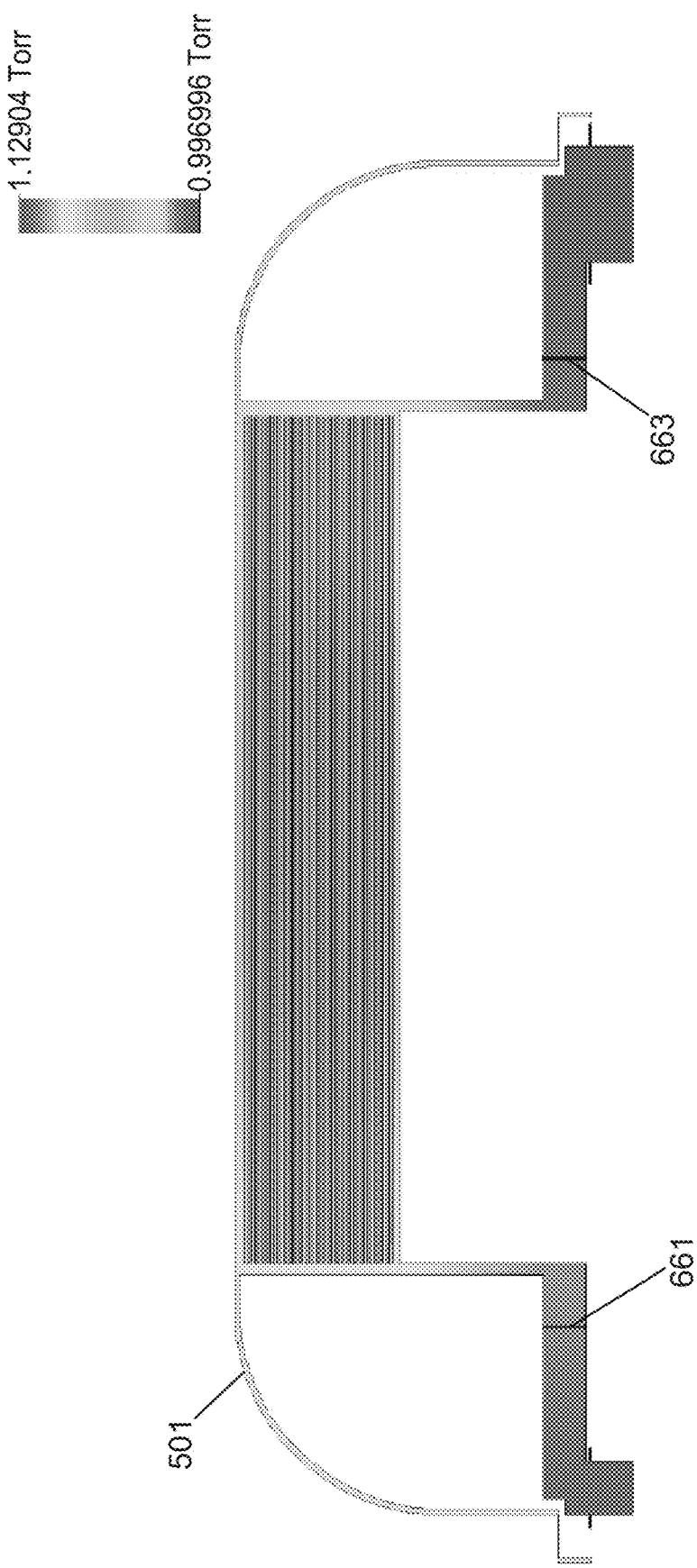
FIG. 6 is a cross-sectional view of an ALD reactor showing pressure differential contours.

FIG. 5 shows the mass fraction of nitrogen in a purge operation of the high pressure drop reactor 501. The input is 2×10$^{-7}$ kg/s with a 1 Torr outlet pressure after 0.68 seconds of starting flow, and the inlet is set initially at about 1 Torr pressure. Reactor 501 includes a plurality of sheets 513 with input edge 516 and output edge 517 and gaps 519 between sheets 513. Contour line 561 indicates a constant mass fraction of nitrogen of about 0.9 while contour line 563 indicates a mass fraction of nitrogen of about 0.2. The region to the left of contour line 561 has a high mass fraction of nitrogen, the mass fraction of nitrogen drops in the transition region 573 and the mass fraction of nitrogen is low in the part of the reactor to the right of region 573. Final inlet pressure and pressure differential are shown in FIG. 6. Isobar 661 indicates a pressure of approximately 1.1 Torr, while isobar 663 indicates a pressure of approximately 1 Torr. The ratio of pressure from the inlet to the outlet is 1.129:1, and the pressure differential across the plates is about 1.06:1.

The substrates or sheets are preferably closely packed to provide sufficient pressure drop. In some embodiments, the gaps between the sheets are about 6 mm or less, or about 3 mm or less or about 2 mm or less. In some embodiments, the gaps between the sheets are in the range of about 2 mm to about 6 mm. The gaps between sheets may be uniform, or may be tapered or other arrangements may be used. Preferably, the reactant predominately flows through the gaps, and the gaps provide an effective resistance to flow. The reactor may be designed such that at least 10% of the reactant fluids forced through the reactor pass through the gaps between the sheets. In some embodiments at least 50% or at least 80% of the reactant fluids forced through the reactor pass through the gaps.

Figure 7:
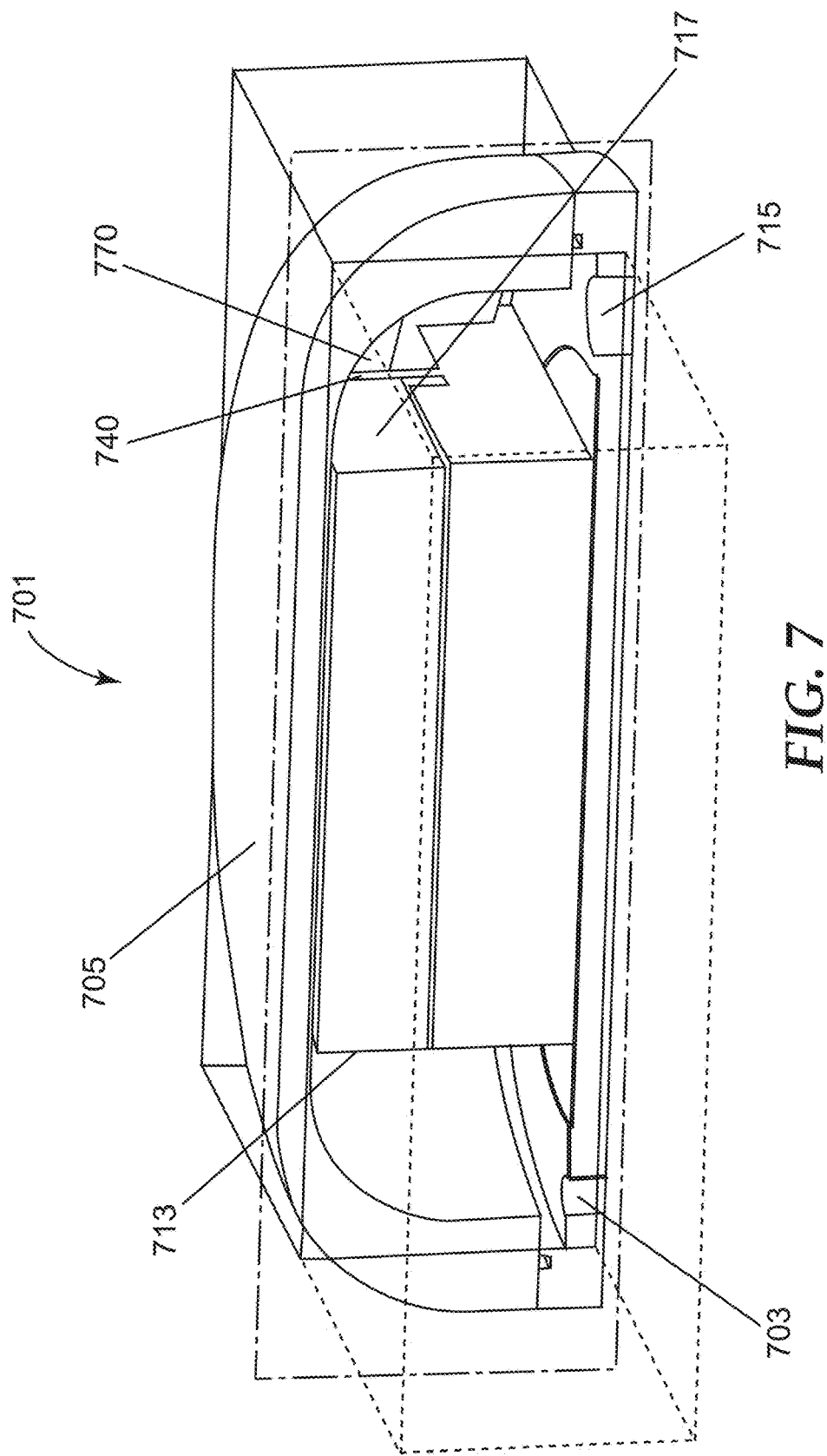
FIG. 7 is a perspective view of a cut away of a reactor.
Figure 8:
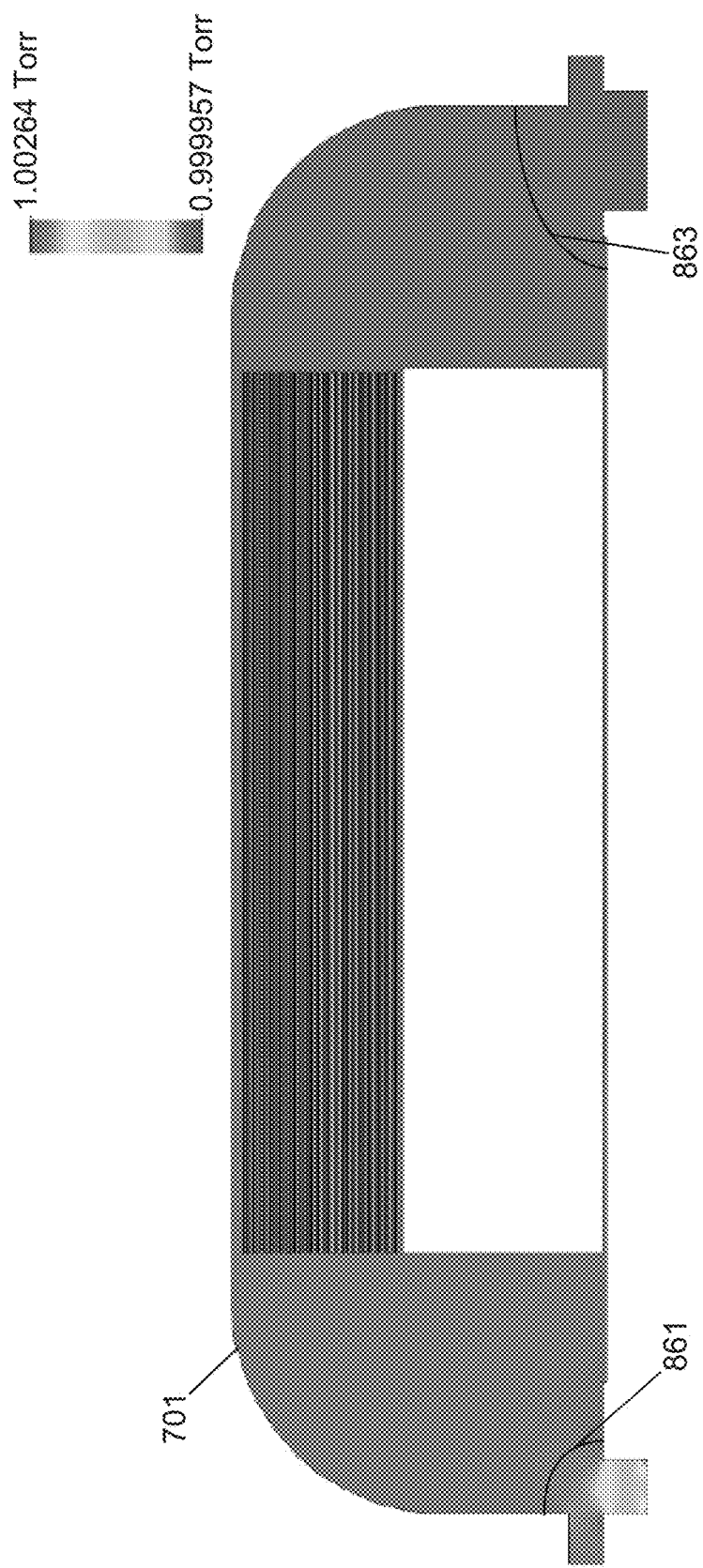
FIG. 8 is a cross-sectional view of the reactor of FIG. 7 showing pressure contours.
Figure 9:
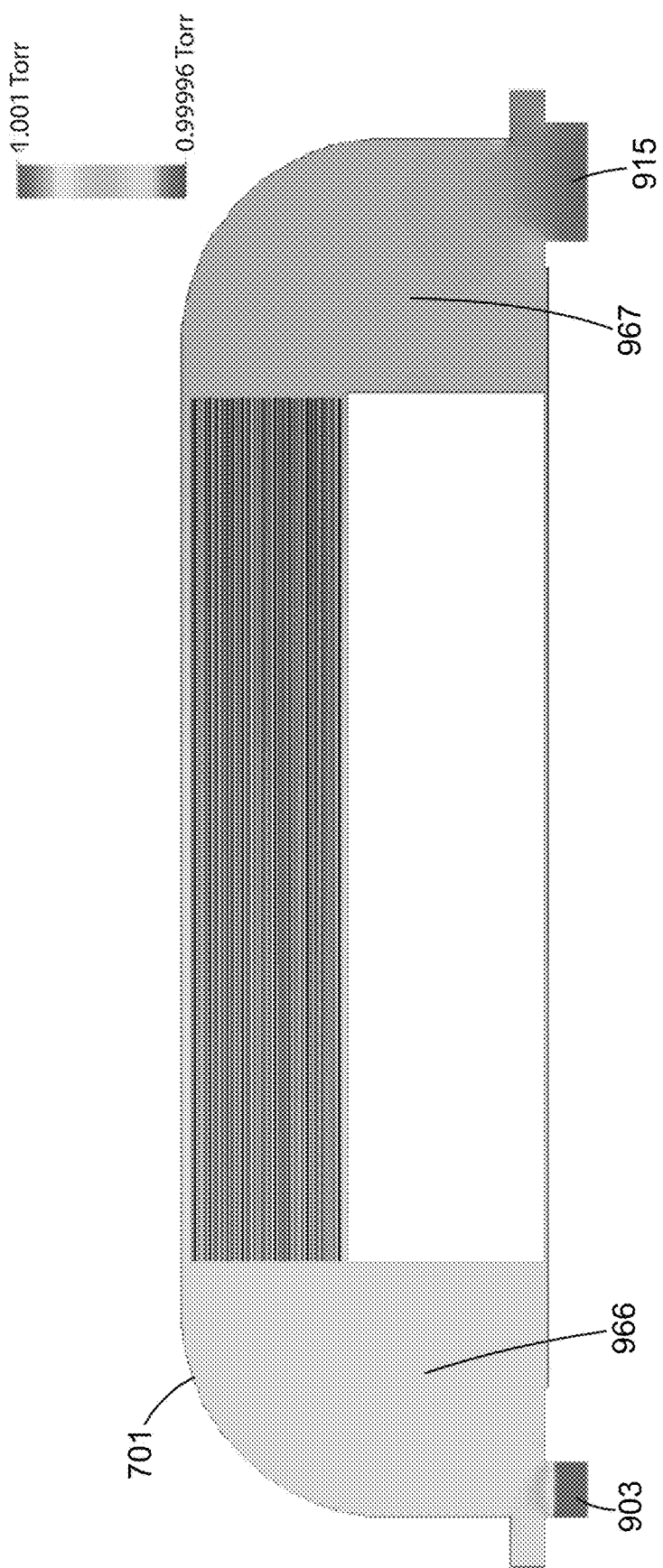
FIG. 9 is a cross-sectional view of the reactor of FIG. 7 showing pressure contours at an expanded scale.
Figure 10:
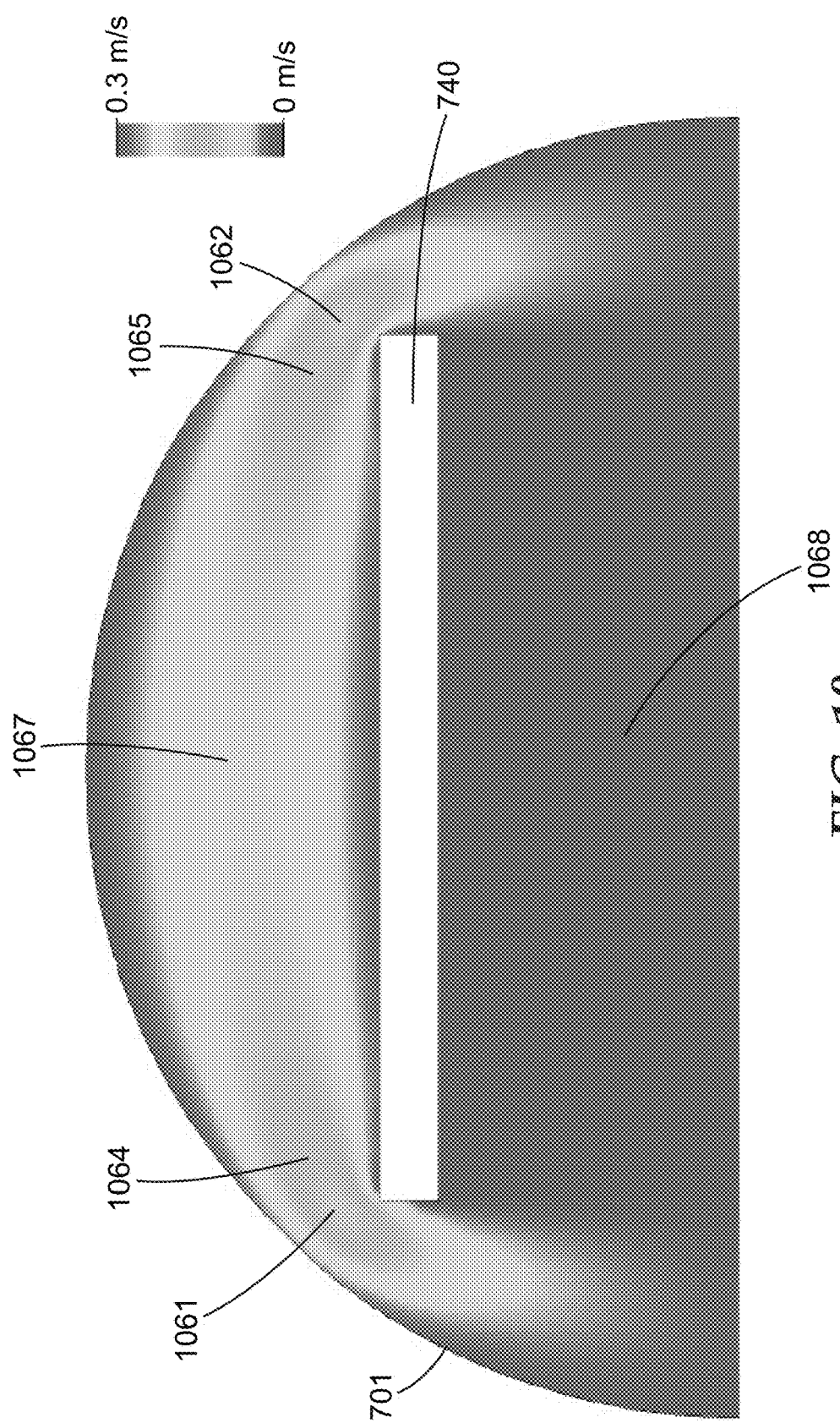
FIG. 10 is a plan view of half of the reactor of FIG. 7 showing velocity contours.
Figure 11:
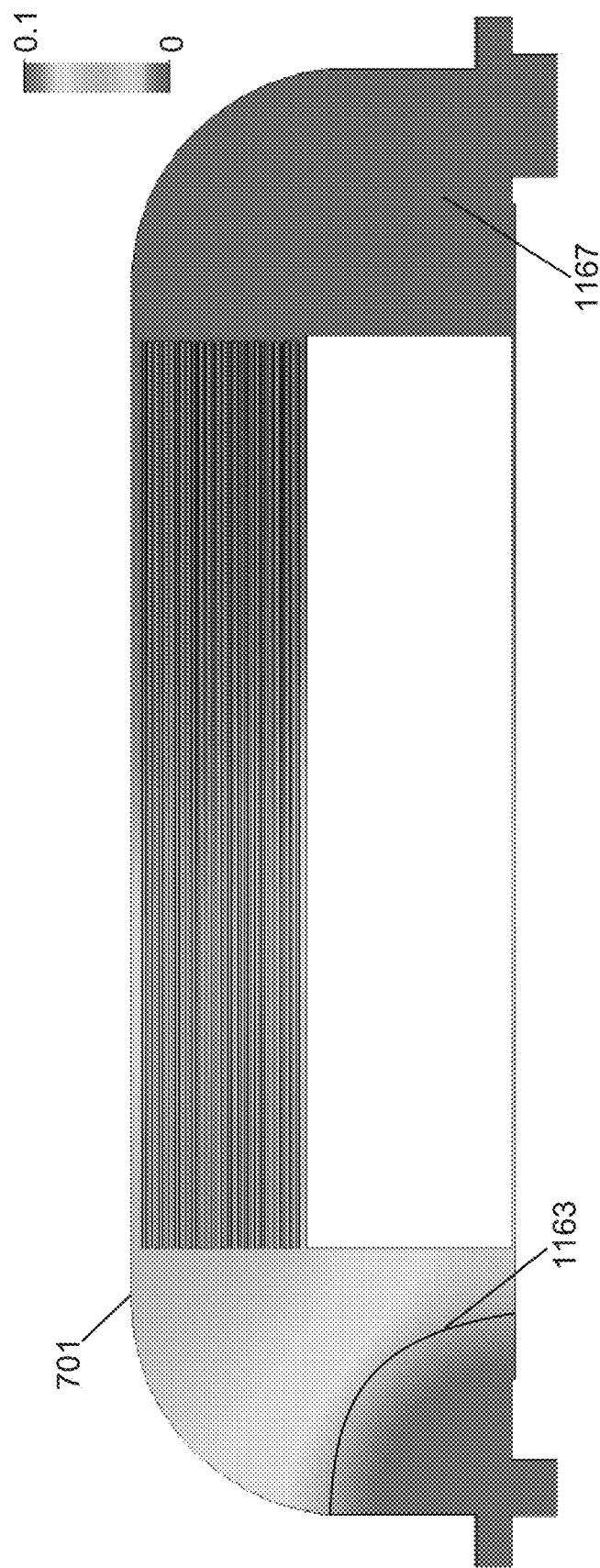
FIG. 11 is a cross-sectional view of the reactor of FIG. 7 showing mass fraction of nitrogen contours at a physical evolved time of 0.19 seconds with an expanded scale of 0 to 0.1.
Figure 12:
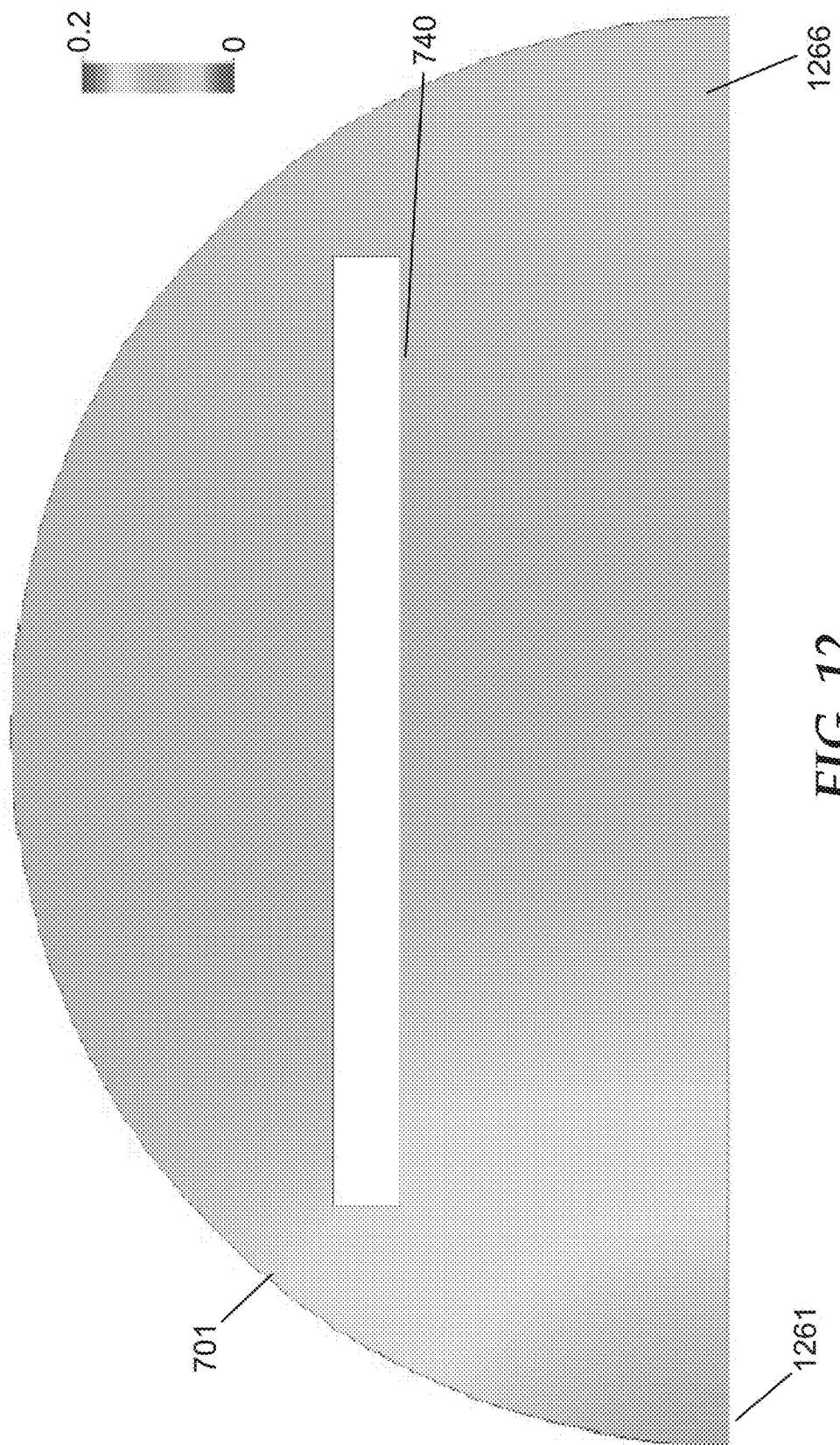
FIG. 12 is a plan view of half of the reactor of FIG. 7 showing mass fraction of nitrogen contours at a physical evolved time of 0.87 seconds with an expanded scale of 0 to 0.2.
Figure 13:
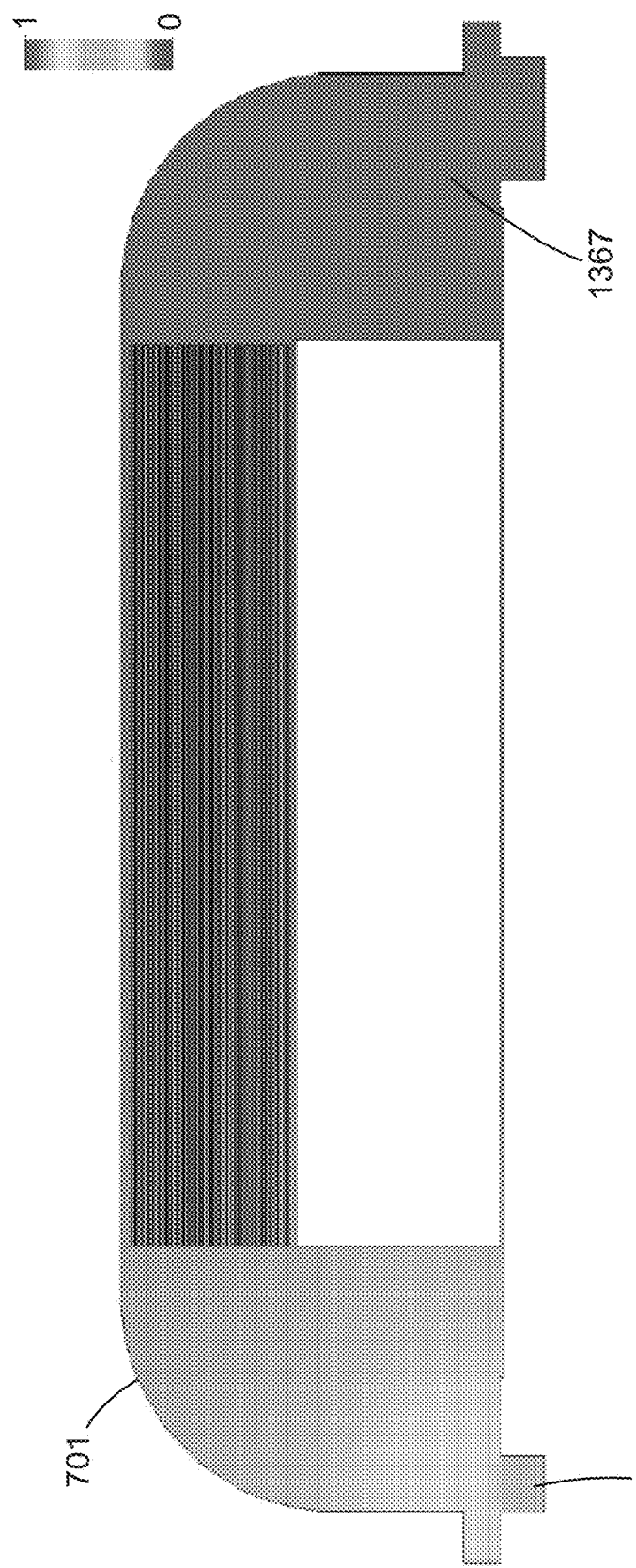
FIG. 13 is a cross-sectional view of the reactor of FIG. 7 showing mass fraction of nitrogen contours at a physical evolved time of 0.87 seconds with a scale of 0 to 1.

FIG. 7 shows a modified reactor 701. The conditions of the previous example were repeated, only the inlet and outlet inserts were removed, and a diffusion region 770 was added adjacent to the stack of plates 713. In FIG. 7, the diffusive region 770 is visible to the back right of the plate holder 740. Stack of plates 713 includes an output edge 717. Modified reactor 701 also includes top portion 705, inlet 703, outlet 715, and plate rack 740. FIG. 8 shows the pressure for different regions of the reactor 701. Isobars 861 and 863 represents pressures of approximately 1 Torr with isobar 861 at a higher pressure than isobar 863. The total pressure drop from the inlet to the outlet is 2.6 mTorr. FIG. 9 shows the same conditions as for FIG. 8, but with the pressure range is expanded to range from 1 to 1.001 Torr. A pressure in input region 966 is higher than a pressure in output region 967. A maximum pressure occurs at the inlet 903 and a minimum pressure at the outlet 915. The pressure drop across the stack of plates is about 0.25 mTorr. FIG. 10 shows a top view velocity profile of ½ of the reactor 701 where plate rack 740 is visible in the figure. The velocity profile in the other ½ of the reactor 701 is given by reflection symmetry. The velocity is a maximum of about 0.2 m/s in regions 1061 and 1062, drops to about 0.15 m/s in regions 1064 and 1065, drops to about 0.08 m/s in region 1067 and is less than about 0.05 m/s in the region 1068 of the stack of plates. FIG. 11 is a side view of the reactor 701 showing nitrogen mass fraction with the scale expanded to range from 0 to 0.1. Contour 1163 indicates a nitrogen mass fraction of about 0.09 while region 1167 has a nitrogen mass fraction of approximately zero. The physical time evolved is 0.19 seconds. FIG. 12 is a top view of the reactor 701 showing the mass fraction of nitrogen at 0.87 seconds with a scale from 0 to 0.2. The mass fraction of nitrogen is about 0.15 in region 1261 and about 0.08 in region 1266. FIG. 12 shows a top view mass fraction profile of ½ of the reactor 701 where plate rack 740 is visible in the figure. The mass fraction profile in the other ½ of the reactor is given by reflection symmetry. FIG. 13 is a side view of the reactor 701 showing the mass fraction at 0.87 seconds with a scale from 0 to 1. Region 1366 has a mass fraction of nitrogen of about 0.5 while region 1367 has a mass fraction of nitrogen of approximately zero.

Figure 14:
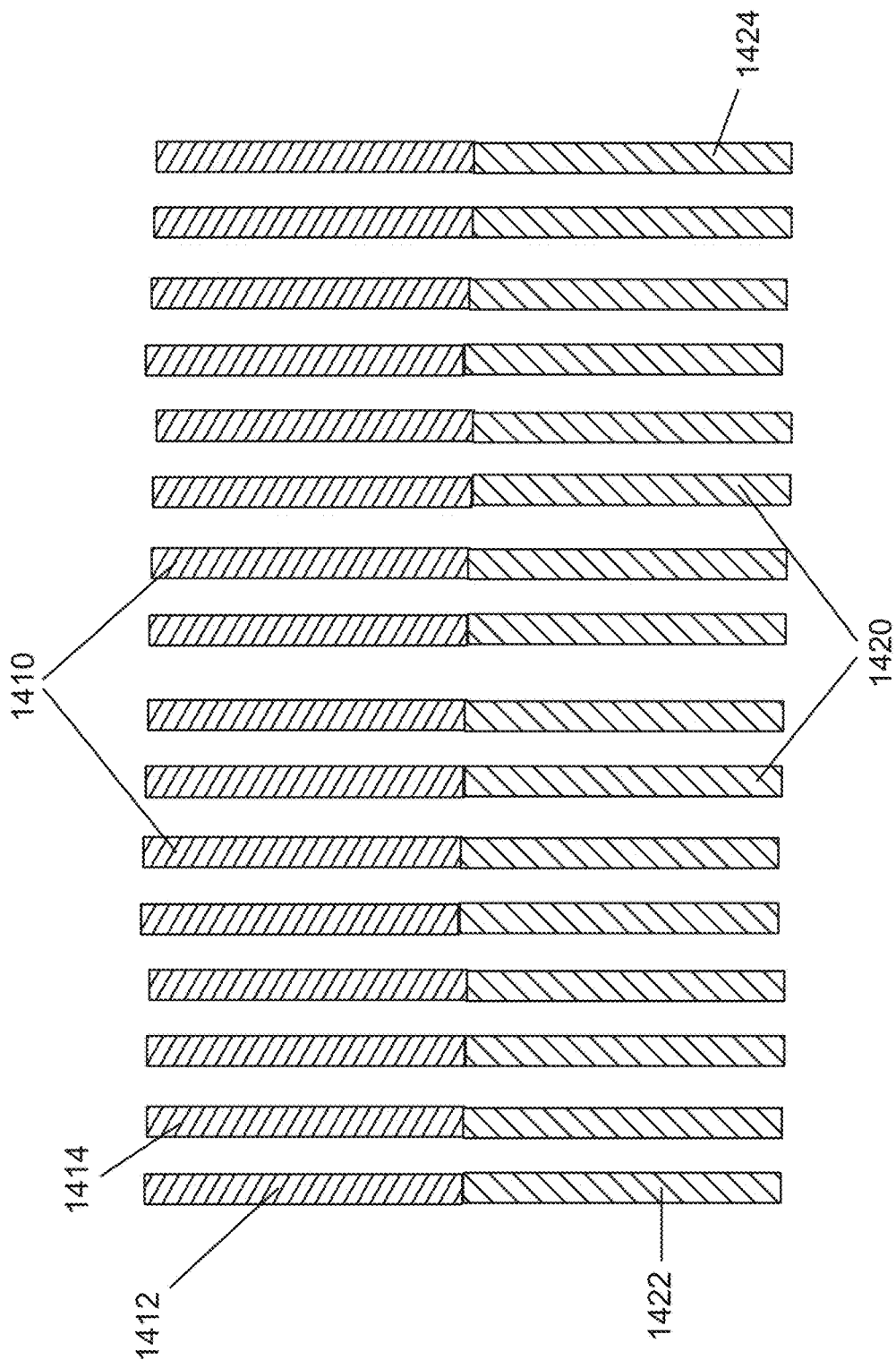
FIG. 14 is a diagram illustrating a ¼ wave reflector design.

An advantage of the ALD process is that it is no more expensive to make the optically thin layers out of a more complex structure. This is useful for creating higher performance reflectors and antireflectors. For example, FIG. 14 shows a standard ¼ wave reflector design with the layers being $MgF_2$ and titania. FIG. 14 shows 12 columns of low index layers 1410 and high index layers 1420 that are to be stacked together to form an alternating stack of low index and high index layer having 24 layers total with layer 1412 an outermost layer and layer 1424 adjacent to a sheet. In other words, the notation of FIG. 14 indicates that low index layer 1412 is deposited on high index layer 1422 which is deposited on low index layer 1414 and this pattern continues until high index layer 1424 is deposited on a sheet. The notation of FIG. 14 is convenient when more complicated layer structures are used. Low index layers 1410 have a refractive index of 1.35 and high index layers 1420 have a refractive index of 2.10. Each of the low index layers and high index layers have a ¼λ (550 nm) phase thickness.

Figure 15A:
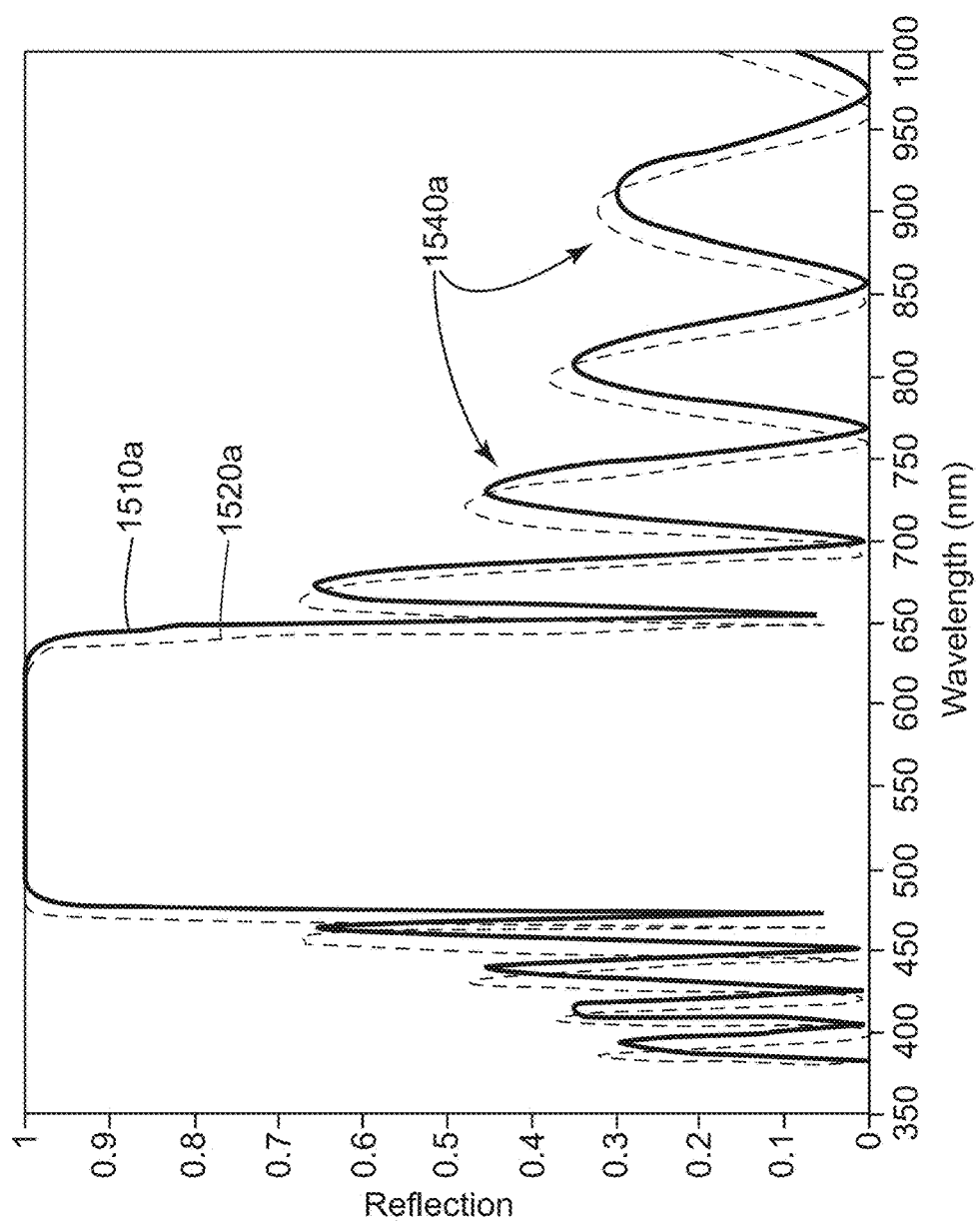
FIGS. 15A and 15B are plots showing the spectra produced by the reflector of FIG. 14.
Figure 15B:
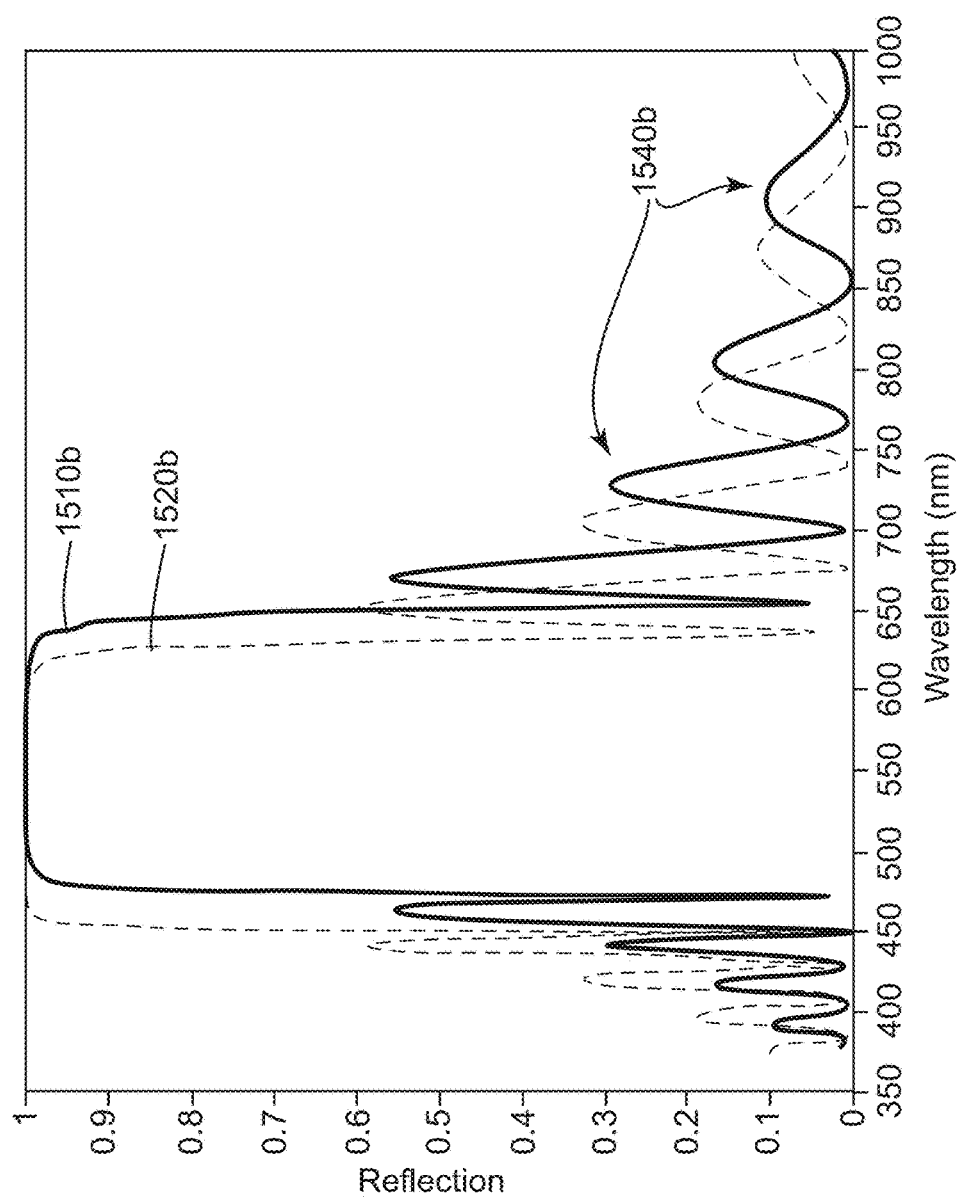

The stack of FIG. 14 produces the spectra shown in FIGS. 15A and 15B. The spectrum in FIG. 15A includes air interface reflections while the spectrum in FIG. 15B was determined with the layers embedded in a medium having a refractive index of 1.725 to eliminate the surface reflections. This did not eliminate the side band reflections 1540a and 1540b. FIG. 15A shows reflectivity at normal incidence 1510a and reflectivity at a 20 degree incidence 1520a. Similarly, FIG. 15B shows reflectivity at normal incidence 1510b and reflectivity at a 20 degree incidence 1520b.

Figure 16:
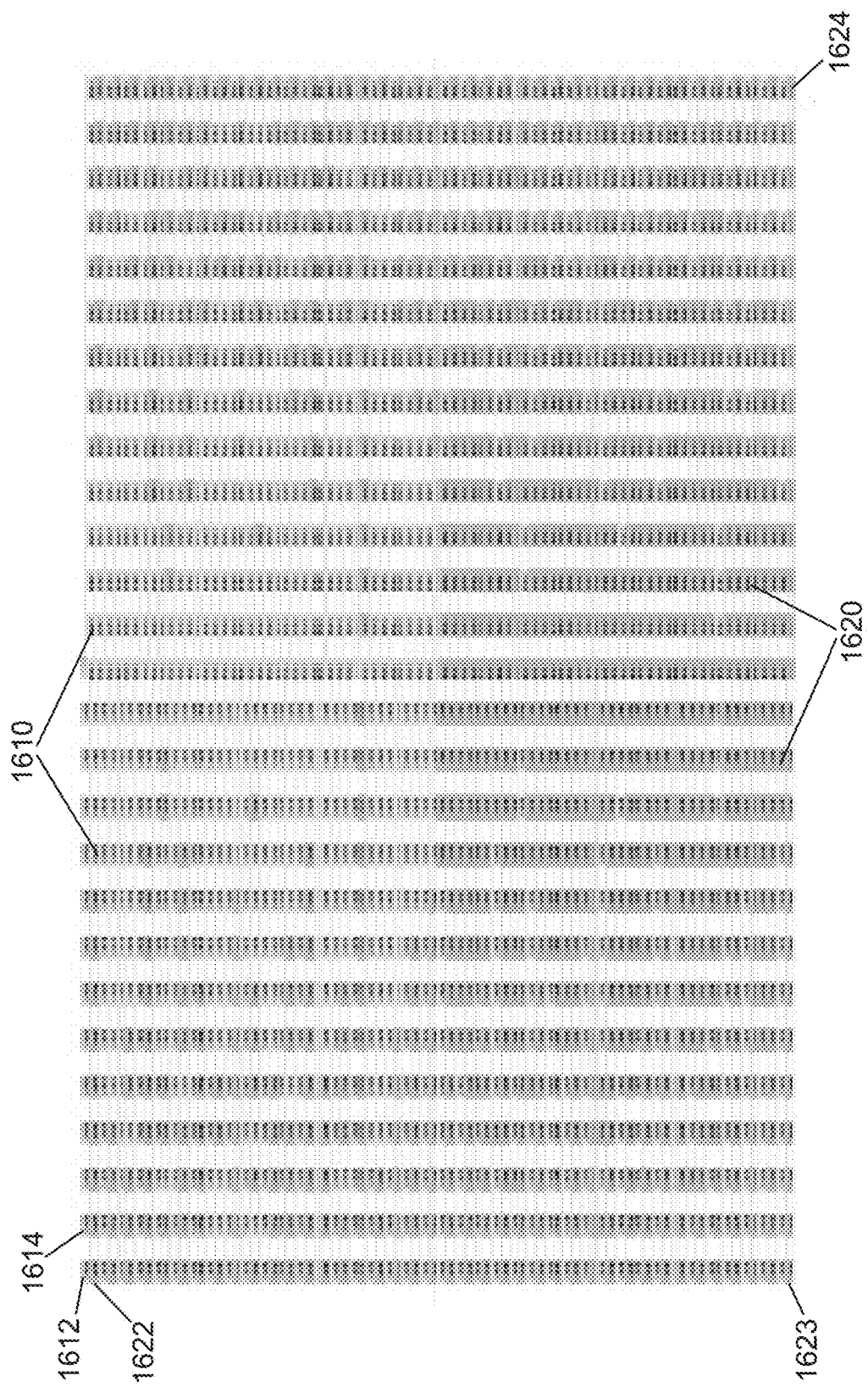
FIG. 16 is a diagram illustrating an approximation of a rugate reflector using sub-optical layers.

FIG. 16 shows a more complex layer structure where the ALD layers are chosen to approximate a rugate reflector designed to reduce side band reflections. The notation of FIG. 16, which is similar to the notation of FIG. 14, indicates that low index layer 1612 is deposited on high index layer 1622 which is deposited on the next layer depicted in the first column of FIG. 16 continuing to low index layer 1623 which is deposited on the first layer of the second column, which is low index layer 1614. This pattern continues until high index layer 1624 is deposited on a sheet. Low index layers 1610 have a refractive index of 1.35 and high index layers 1620 have a refractive index of 2.10. Each of the low index layers and high index layers have a $1/160^{th}$ λ (550 nm) phase thickness. There are 80 layers in each of the 27 columns shown in FIG. 16.

Figure 17A:
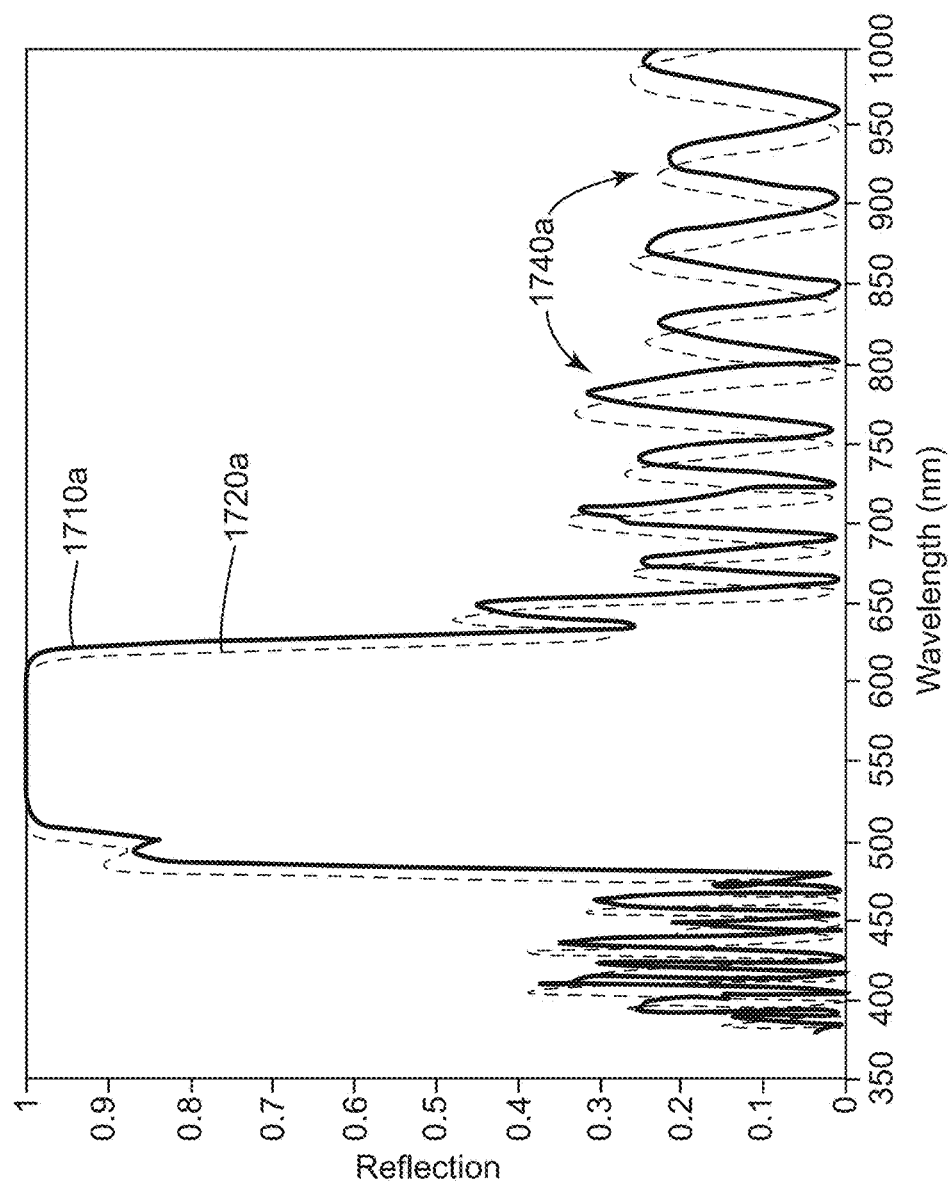
FIGS. 17A-17B are plots showing the spectra, and the suppression of the side bands, produced by the reflector of FIG. 16.
Figure 17B:
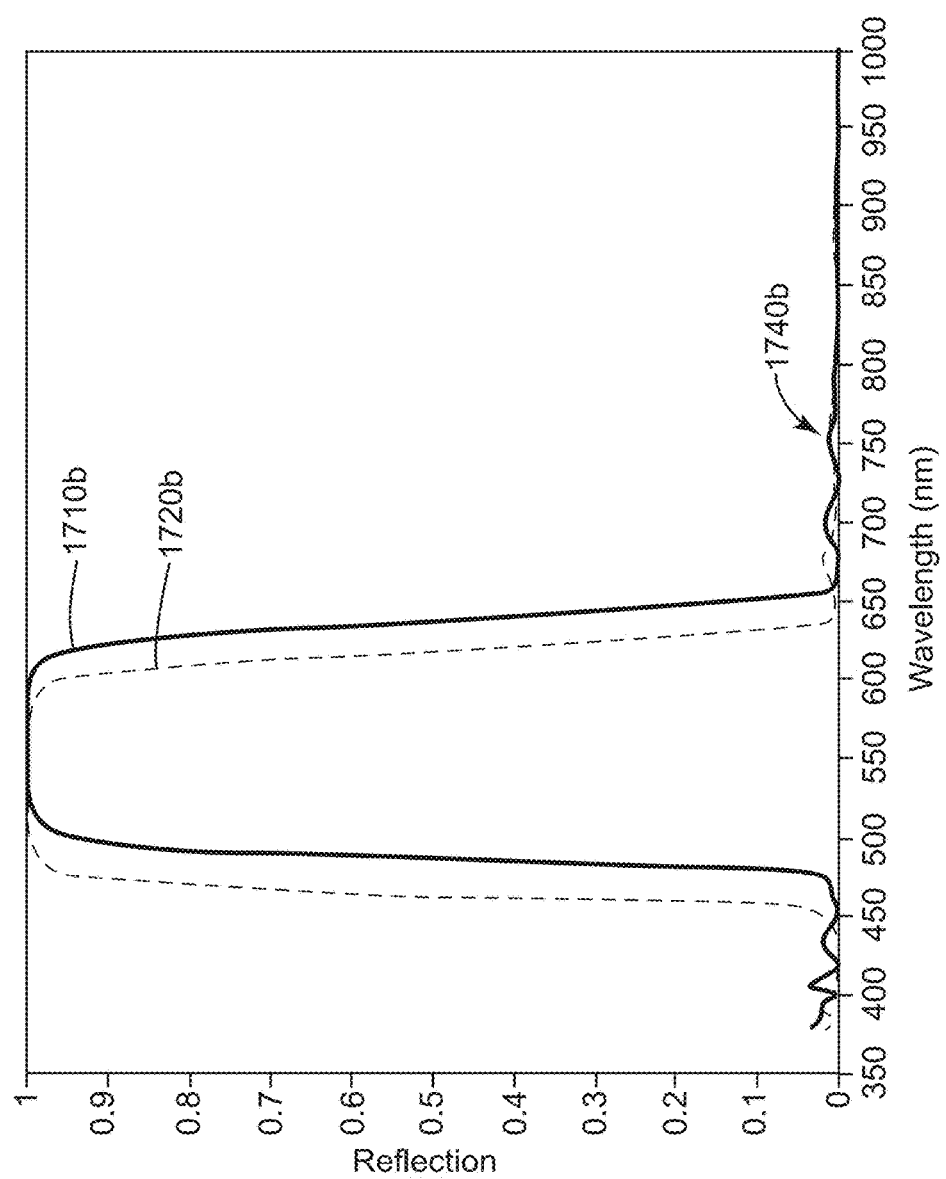

The stack of FIG. 16 produces the spectra shown in FIGS. 17A and 17B. The spectrum in FIG. 17A includes air interface reflections while the spectrum in FIG. 17B was determined with the layers embedded in a medium having a refractive index of 1.725 to eliminate the surface reflections. This significantly reduced the side band reflections 1740a resulting in small sideband reflections 1740b. FIG. 17A shows reflectivity at normal incidence 1710a and reflectivity at a 20 degree incidence 1720a. Similarly, FIG. 17B shows reflectivity at normal incidence 1710b and reflectivity at a 20 degree incidence 1720b. In practice, an antireflection coating may be applied to the layer structure in order to reduce or eliminate the air interface reflections. FIG. 17B indicates that an antireflection coating is effective in significantly reducing or substantially eliminating side band reflections.

In some embodiments of the present description, fluorosilane or organometallic materials or a combination thereof are deposited onto a substrate, for example, sapphire sheets. The reactors of the present description allow for a sufficiently long deposition time while still having a high throughput, thereby allowing such coatings to be applied. In some embodiments, sapphire sheets are placed in a reactor. For example, a silane vapor may be used to deposit silica onto the sapphire sheets to improve adhesion of subsequently deposited materials resulting from fluorosilane or organometallic materials. This can be done, for example, by passing an inert carrier gas containing vaporized silane through the reactor followed by purging with an inert gas such as nitrogen. Then a carrier gas containing vaporized fluorosilane or organometallic material may be passed through the reactor to provide sapphire sheets having one or both sides coated with an organometallic or a fluorosilane. A subsequent step may involve passing through the reactor an inert carrier gas containing a material that reacts with the previously coated fluorosilane or organometallic material.

Figure 21:
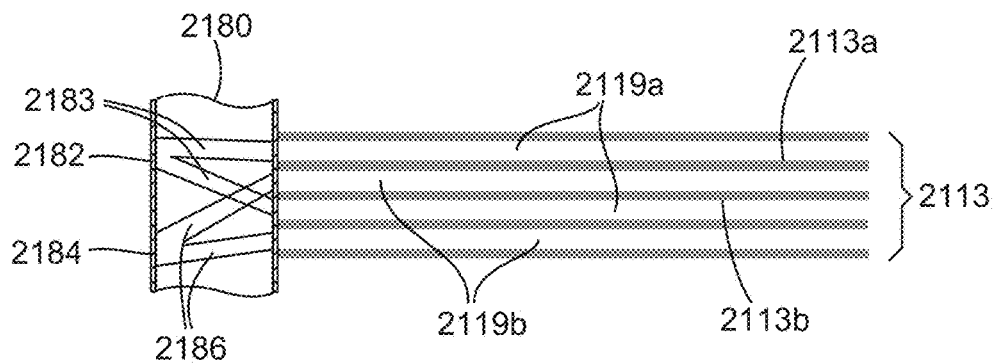
FIG. 21 is a schematic cross-sectional view of a manifold and a portion of a stack of plates.

In some embodiments, a first fluid is forced through a first set of gaps between sheets and a second fluid different from the first fluid is forced through a second set of gaps between sheets different from the first set of gaps. In some embodiments, the first fluid deposits a first coating on a first major surface of at least one sheet and the second fluid deposits a second coating on a second major surface of the at least one sheet. This can be carried out using a manifold 2180 as illustrated in FIG. 21. Manifold 2180 includes a first input 2182 which directs a first fluid through a first set of channels 2183 to a first set of gaps 2119a in the plurality of sheets 2113. Manifold 2180 also includes a second input opening 2184 which directs a second fluid through a second set of channels 2186 to a second set of gaps 2119b in the plurality of sheets 2113. Manifold 2180 includes a fluid distribution system provided by channels 2183 and 2186. The first fluid deposits a first coating on a first side of at least one of the sheets in the plurality of sheets 2113. For example, an upper surface of sheet 2113a is coated with a first coating and a lower surface of sheet 2113b is coated with a second coating in the configuration shown in FIG. 21. The first and second coatings may have substantially the same composition. The second fluid deposits a third coating on a second side of at least one of the sheets in the plurality of sheets 2113. For example, a lower surface of sheet 2113a is coated with a third coating and an upper surface of sheet 2113b is coated with a fourth coating in the configuration shown in FIG. 21. The third and fourth coatings may have substantially the same composition and the third and fourth coatings may have a composition that is substantially different from the composition of the first and second coatings.

Figure 22A:
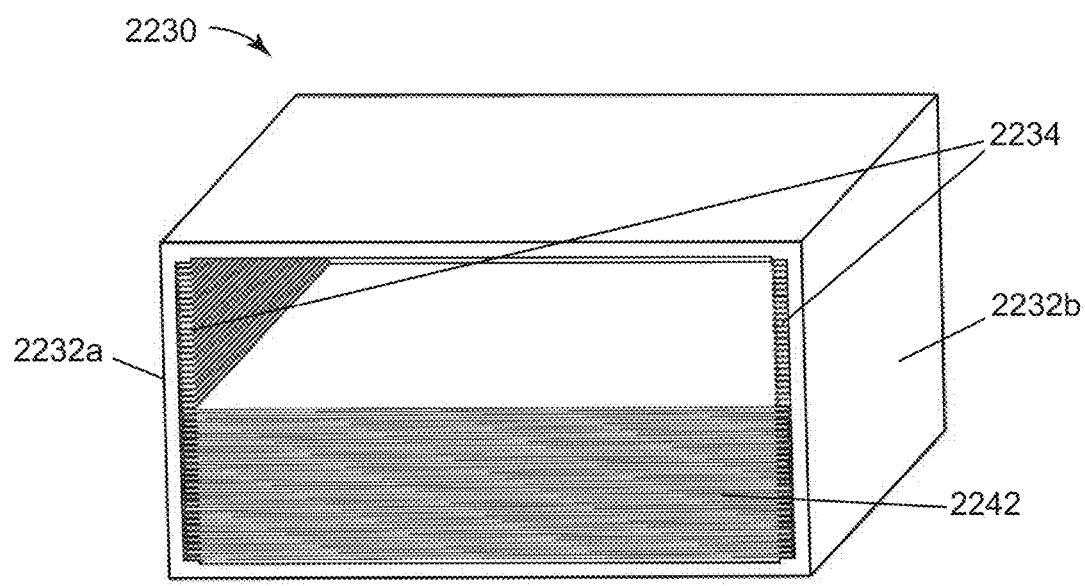
FIG. 22A is a perspective view of a container including a stack of plates.
Figure 22B:
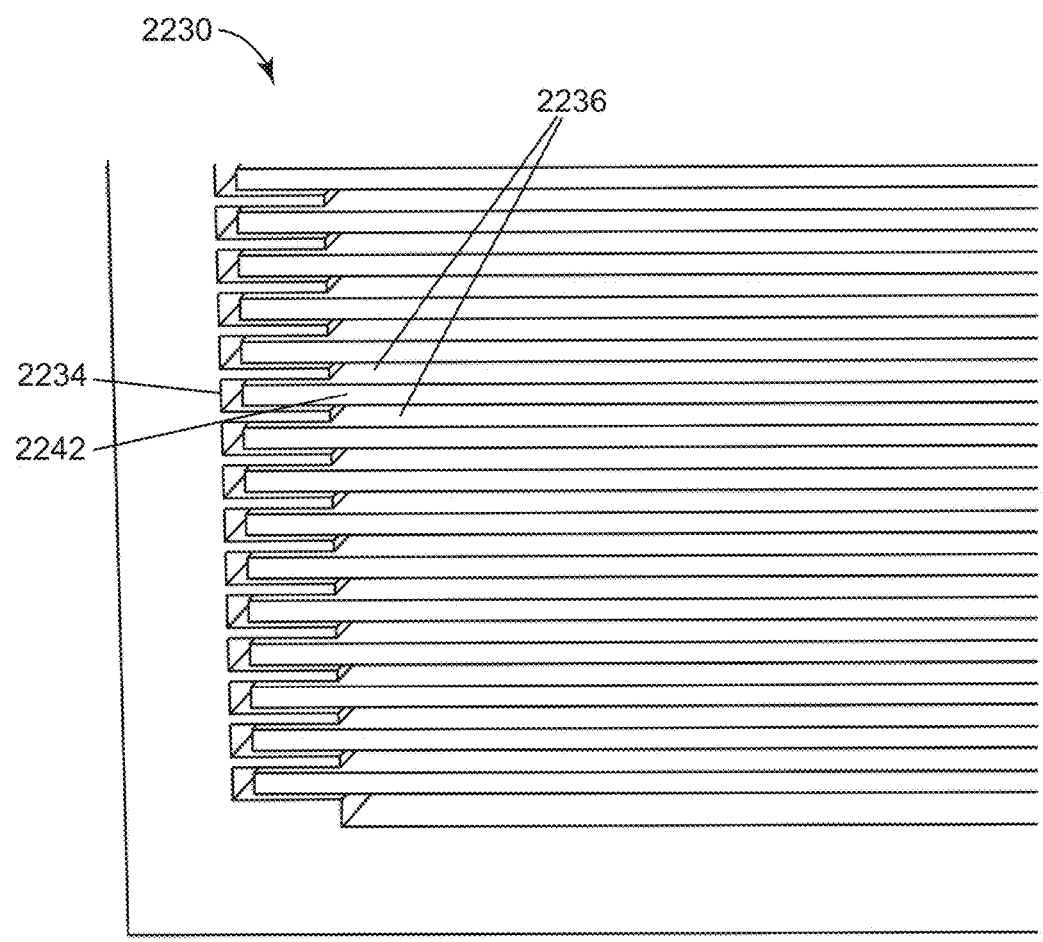
FIG. 22B is a cross-sectional view of a portion of the container of FIG. 22A.

In some cases it is desired to coat a plurality of sheets or plates that are thin and fragile. In some embodiments, the reactor is designed so that the support structure containing the stack of plates can be removed from the reactor and used as a shipping container. This can allow the stack of coated plates to be shipped without having to remove the plates from the support structure and repackage them for shipping. The support structure can be returned to the shipper after the recipient has removed the coated plates. In some aspects of the present description, a support structure is provided that includes a plate rack, a plurality of coated plates disposed in the plate rack, and a manifold that includes a fluid distribution system. FIG. 22A shows a container 2230 suitable for coating, storage, and shipping sheets or plates. The container 2230 includes side support structures 2232a and 2232b. The side structures have cutouts 2234 that allow an array of substrate plates 2242 to fill the container. Cutouts 2234 form a plate rack for holding and constraining plates 2242. FIG. 22A shows the container 2230 about one half full of plates. During normal use, container 2230 will typically filled with plates 2242. FIG. 22B shows a detailed drawing of a portion of container 2230, where cutouts 2234 constrain plates 2042 and provide space 2236 for reactant flow.

EXAMPLES

Example 1

The reactor shown in FIG. 4 was installed into a Savannah 200 Atomic Layer Deposition Unit with Dome Lid. Approximately 20, 15.9×11.4 cm 0.2 mm thick optical grade borosilicate glass plates were loaded into the reactor (glass plate part number 260454, Ted Pella Inc, Redding Calif.). Ozone was provided by an INUSA Ozone Generator set at 17% concentration.

The Base/Purge Flow was 20 sccm of $N_2$. The temperature profile that was used is listed in Table 1 below. TDMAT is Tetrakis(dimethylamino)titanium.

TABLE 1

| Temperature Profile | ° C. |
| --- | --- |
| Trap/Pump | 150 |
| Stop Valve | 150 |
| Outer Heater | 250 |
| Inner Heater | 250 |
| Precursor Manifold | 150 |
| Water | Set: 10° C.; Actual ~35° C. |
| Ozone | Set: 10° C.; Actual ~35° C. |
| TDMAT | 75 |
| Lid 2 | Set: 10° C.; Actual ~235° C. |
| Lid 1 | 250 |
| TMA | Set: 10° C.; Actual ~35° C. |

The $TiO_2$ cycle that was used is specified in Table 2 below.

TABLE 2

| | Time (seconds) |
| --- | --- |
| TDMAT | 0.25 |
| Purge | 8 |
| Ozone | 0.015 |
| Purge | 3 |
| Ozone | 0.015 |
| Purge | 10 |

The $Al_2O_3$ cycle that was used is specified in Table 3 below. TMA is Trimethylaluminum.

TABLE 3

| | Time (seconds) |
| --- | --- |
| TMA | 0.025 |
| Purge | 6 |

TABLE 3-continued

| | Time (seconds) |
| --- | --- |
| Water | 0.025 |
| Purge | 6 |

The number of cycles per precursors is specified in Table 4 below.

TABLE 4

| Presursor | Number of Cycles |
| --- | --- |
| TDMAT | 1007 |
| TMA | 1116 |
| TDMAT | 674 |
| TMA | 151 |
| TDMAT | 1664 |
| TMA | 415 |
| TDMAT | 1417 |
| TMA | 536 |
| TDMAT | 1624 |
| TMA | 225 |
| TDMAT | 959 |
| TMA | 259 |
| TDMAT | 1561 |
| TMA | 100 |

Figure 18:
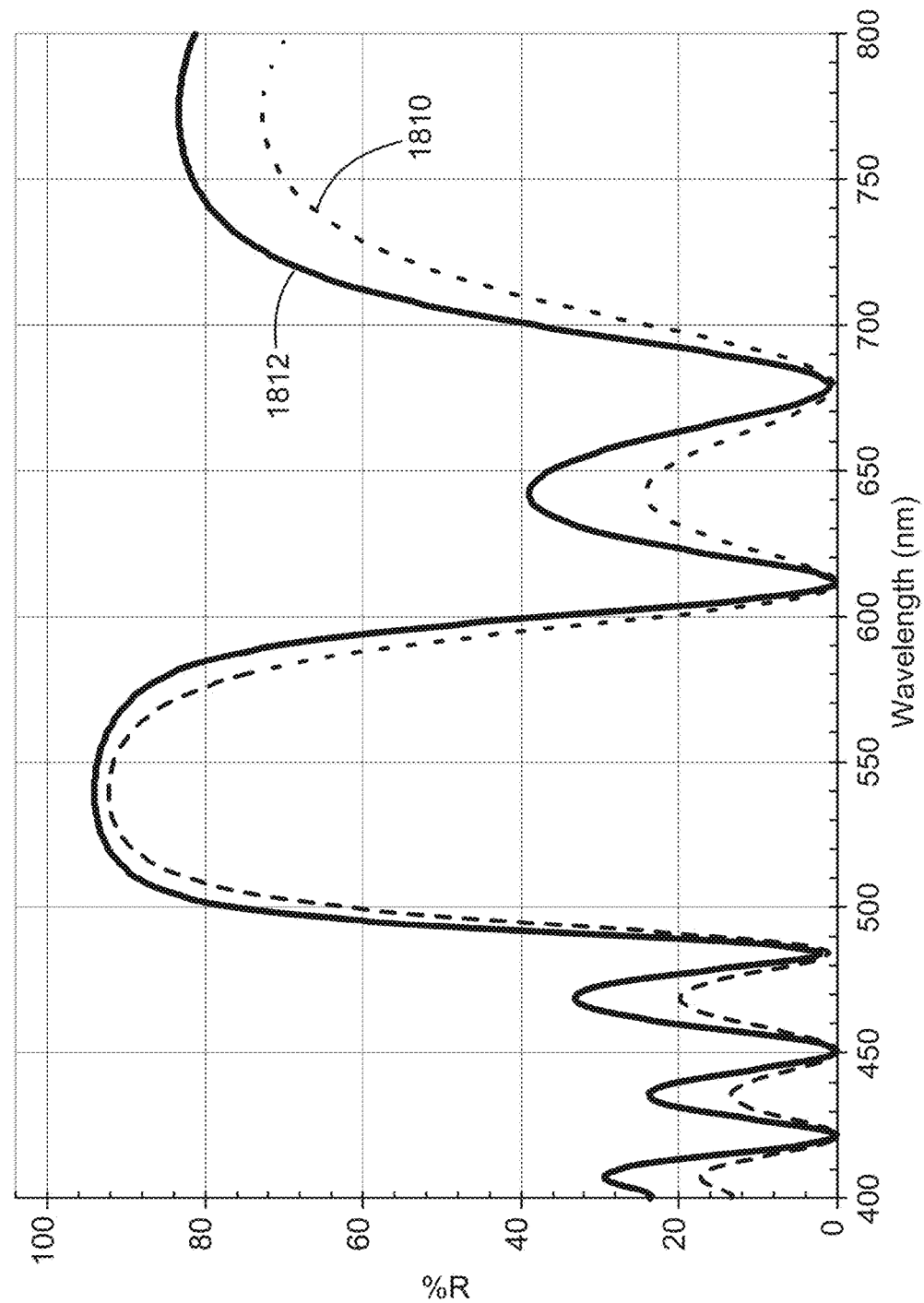
FIG. 18 is a plot of the design target for percent reflectance versus wavelength for a reflector.
Figure 19:
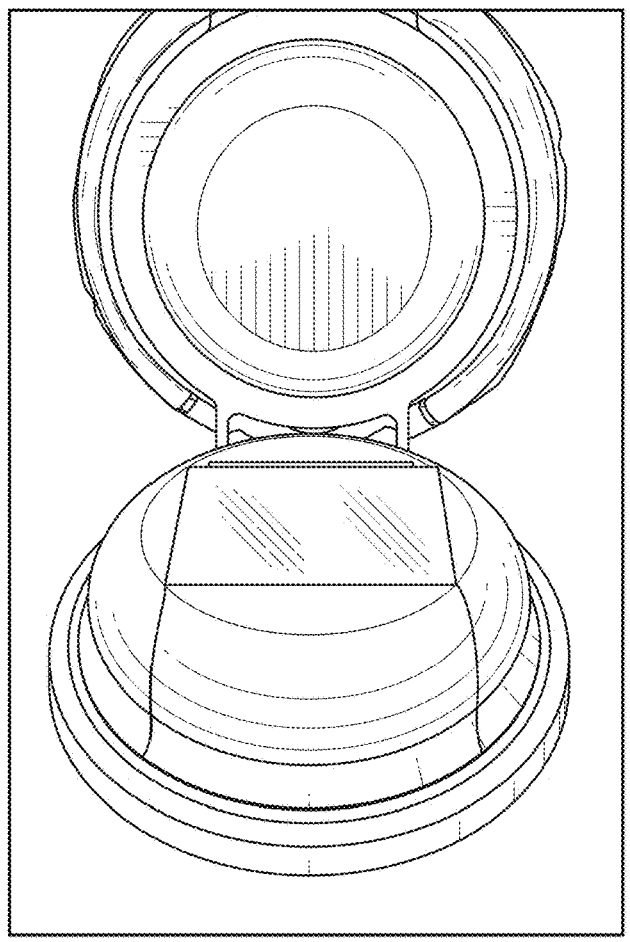
FIG. 19 is a drawing of a reactor with a stack of glass plates.
Figure 20:
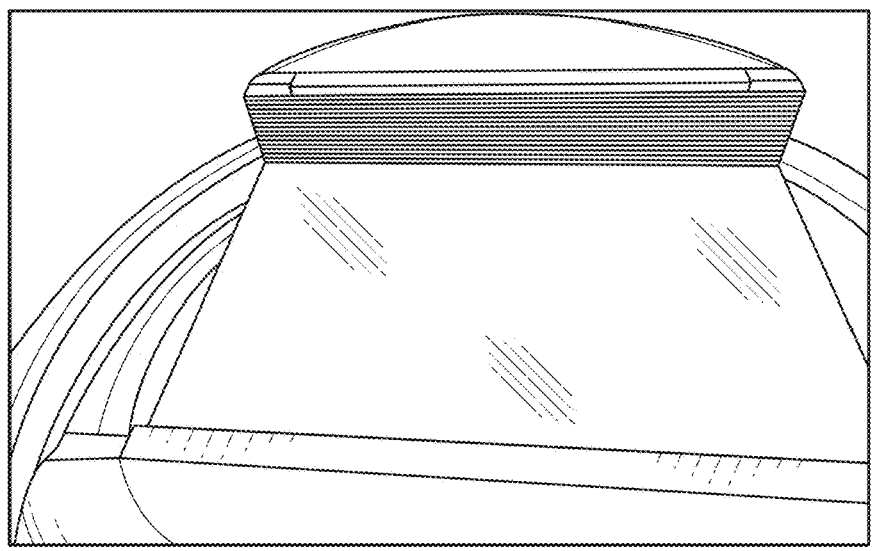
FIG. 20 is a drawing of the reactor of FIG. 19 where the reactor is disassembled with most of the glass plates removed.

The design target is shown in FIG. 18 which shows curve 1810 giving the percent reflection of light incident from a front of the sheet when only the front side of the sheet is coated and shows curve 1812 giving the percent reflection when both sides of the sheet are coated. A drawing of the reactor with the sheets in place is shown in FIG. 19. FIG. 20 is a drawing of the reactor of FIG. 19 disassembled with most of the glass plates removed.

The input side of the reactor (left) showed evidence of CVD of either the alumina or the titania, or both, likely due to insufficient purging. There was an extended section of coating that is close to the design target, and then a clear region that was depleted of reactant.

Example 2: Layer-by-Layer (LBL) Deposition of a Multilayer Optical Coating on Glass Coating solutions that may be used include:
1) Polydiallyldimethylammonium chloride (PDADMAC) (a positively charged polymer available from PolySciences, Inc., Warrington, Pa. as a 20 wt % aqueous solution) with MW 240K at 0.1 wt % in water with pH adjusted to pH 3 with nitric acid.
2) Silica ($SiO_2$) nanoparticles (available from Nalco Company, Naperville, Ill. as a 15 wt % aqueous suspension under the trade name "Nalco 2326") with average diameter of 5 nm at a concentration of 0.1 wt % in water with pH adjusted to pH 3 with nitric acid. The $SiO_2$ is negatively charged at pH 3.
3) Anatase titania ($TiO_2$) nanoparticles (available from U.S. Research Nanomaterials as a 15 wt % aqueous suspension) with average diameter of 5-15 nm at a concentration of 0.1 wt % in water with pH adjusted to pH 2 with nitric acid and NaCl added to a concentration of 0.1 M. The $TiO_2$ is positively charged at pH 2.
4) Poly(sodium 4-styrenesulfonate) (PSS) (a negatively charged polymer available from Sigma Aldrich (St. Louis, Mo.) with MW 70K at 0.1 wt % in water with a pH adjusted to pH 2 with nitric acid.

Borosilicate glass plates are loaded into the reactor as described in Example 1.

In general, the above coating solutions are pumped through the reactor alternately at a velocity that maintains uniform, plug flow. Intermediate rinse steps are needed to remove excess material and preserve the self-limiting nature of the coating process. Each deposition step reverses the ionic charge on the substrate allowing for subsequent deposition of oppositely charged species (polyelectrolytes or metal oxide nanoparticles).

First, a high refractive index optical stack is deposited onto the glass substrates in the reactor. The $TiO_2$ nanoparticle suspension is pumped through the reactor. Roughly a monolayer of $TiO_2$ nanoparticles deposits on the surface of the glass, reversing the surface charge from negative to positive. Next, a purge solution of deionized water is pumped through to remove excess $TiO_2$. Next, a PSS solution is pumped through the reactor, which adsorbs roughly a monolayer of PSS polymer and reverses the surface charge from positive to negative. Next, a purge solution of deionized water is pumped through to remove excess PSS. This cycle is repeated five times to deposit five "bi-layers" denoted as $(TiO_2/PSS)_5$. The coating will have a thickness of approximately 50 nm and a refractive index at 633 nm of approximately 1.84.

Next, a low refractive index optical stack is deposited on top of the high refractive index stack. The PDADMAC solution is pumped through the reactor. Roughly a monolayer of PDAC polymer deposits on the surface of the glass, reversing the surface charge from negative to positive. Next, a purge solution of deionized water is pumped through to remove excess PDADMAC. Next, a $SiO_2$ solution is pumped through the reactor, which adsorbs roughly a monolayer of $SiO_2$ nanoparticles and reverses the surface charge from positive to negative. Next, a purge solution of deionized water is pumped through to remove excess $SiO_2$. This cycle is repeated three times to deposit three "bi-layers" denoted as $(PDADMAC/SiO_2)_3$. The coating will have a thickness of approximately 50 nm and a refractive index at 633 nm of approximately 1.33.

Depositing multiple dyads of the above high and low refractive index stacks will create a multilayer optical coating with peak reflection centered in the ultraviolet range.

The structured sheets may include simple or complex curves to complex three-dimensional shapes. The 3D shapes or curves may be nested into each other. For example, a sheet may have an array of hemispherical hollow domes, and sheets with these domes may be nested together to create a compact array of sheets, allowing a predominately plug-flow coating.

Although specific embodiments have been illustrated and described herein, it will be appreciated by those of ordinary skill in the art that a variety of alternate implementations can be used for the specific embodiments shown and described without departing from the scope of the present disclosure. This application is intended to cover any adaptations or variations of the specific embodiments discussed herein.

The invention claimed is:

1. A method of coating sheets, comprising the steps of:
providing a plurality of sheets with gaps between the sheets, the sheets having an input edge and an output edge; and
forcing a fluid through the gaps,
wherein the fluid flow through the gaps has a substantially plug flow profile and the fluid deposits a coating on at least one surface of the plurality of sheets in a self-limiting deposition process, and
wherein the fluid comprises a first fluid and a second fluid having a different composition than the first fluid; the gaps between the sheets comprise a first set of gaps and a different second set of gaps; and forcing the fluid through the gaps comprises forcing the first fluid through the first set of gaps and not through the second set of gaps, and forcing the second fluid through the second set of gaps and not through the first set of gaps.

2. The method of claim 1, wherein the fluid is a gas.

3. The method of claim 1, wherein the fluid is a liquid or a combination of a liquid and a gas.

4. The method of claim 1, wherein a ratio of an input pressure of the fluid on the input edge to an output pressure of the fluid on the output edge is at least 1.01.

5. The method of claim 4, wherein the ratio is at least 1.05.

6. The method of claim 5, wherein the ratio is at least 1.1.

7. The method of claim 6, wherein the ratio is as least 1.2.

8. The method of claim 1, wherein the self-limiting deposition process comprises atomic layer deposition.

9. The method of claim 1, wherein the self-limiting deposition process comprises layer-by-layer self-assembly.

10. The method of claim 1, wherein the gaps are in the range of 2 mm to 6 mm.

11. The method of claim 1, further comprising the steps of placing the plurality of sheets in a reactor and forcing a fluid through the reactor.

12. The method of claim 11, wherein at least 50% of the fluid forced through the reactor passes through the gaps between the sheets.

13. The method of claim 12, wherein at least 80% of the fluid forced through the reactor passes through the gaps between the sheets.

14. The method of claim 11, wherein the reactor provides space for gas flow adjacent the input edge of the sheets and the space has a width in the range of 1 to 5 mm.

15. The method of claim 1, wherein the fluid deposits a coating on a first surface of each sheet and on a second surface of each sheet.

16. The method of claim 1, wherein the sheets comprise polymer, glass, metal, ceramic, or a combination thereof.

17. The method of claim 16, wherein the sheets are glass sheets.

18. The method of claim 1, wherein the sheets comprise sapphire.

19. The method of claim 1, wherein the coating comprises an organometallic material or a fluorosilane or a combination thereof.

20. The method of claim 1, wherein the first fluid deposits a first coating on a first major surface of at least one sheet and the second fluid deposits a second coating on a second major surface of the at least one sheet.

21. The method of claim 1, wherein the coating comprises inorganic and organic materials.

22. The method of claim 21, wherein the coating further comprises fluorosilane.

* * * * *

UNITED STATES PATENT AND TRADEMARK OFFICE
CERTIFICATE OF CORRECTION

PATENT NO. : 10,072,333 B2
APPLICATION NO. : 14/905223
DATED : September 11, 2018
INVENTOR(S) : Andrew Ouderkirk et al.

Page 1 of 1

It is certified that error appears in the above-identified patent and that said Letters Patent is hereby corrected as shown below:

In the Specification

Column 8
Line 12, delete "Presursor" and insert -- Precursor --, therefor.

In the Claims

Column 10
Line 22 (Approx.), in Claim 7, delete "as least" and insert -- at least --, therefor.

Signed and Sealed this
Sixteenth Day of April, 2019

Andrei Iancu
*Director of the United States Patent and Trademark Office*